United States Patent
Weichart et al.

(10) Patent No.: US 11,742,187 B2
(45) Date of Patent: Aug. 29, 2023

(54) RF CAPACITIVE COUPLED ETCH REACTOR

(71) Applicant: Evatec AG, Trubbach (CH)

(72) Inventors: Johannes Weichart, Balzers (LI); Jurgen Weichart, Balzers (LI)

(73) Assignee: EVATEC AG, Trubbach (CH)

( * ) Notice: Subject to any disclaimer, the term of this patent is extended or adjusted under 35 U.S.C. 154(b) by 192 days.

(21) Appl. No.: 16/473,775

(22) PCT Filed: Oct. 17, 2017

(86) PCT No.: PCT/EP2017/076506
§ 371 (c)(1),
(2) Date: Jun. 26, 2019

(87) PCT Pub. No.: WO2018/121898
PCT Pub. Date: Jul. 5, 2018

(65) Prior Publication Data
US 2019/0341231 A1    Nov. 7, 2019

(30) Foreign Application Priority Data
Dec. 27, 2016  (CH) .................................. 01750/16
Mar. 8, 2017   (CH) .................................. 00279/17

(51) Int. Cl.
*H01L 21/00* (2006.01)
*H01J 37/32* (2006.01)
(Continued)

(52) U.S. Cl.
CPC ........ *H01J 37/32834* (2013.01); *C23C 14/35* (2013.01); *C23C 16/4412* (2013.01);
(Continued)

(58) Field of Classification Search
CPC ..................... H01J 37/32633; H01J 37/32422
See application file for complete search history.

(56) References Cited

U.S. PATENT DOCUMENTS 3,661,761 A     5/1972   Koenig
4,969,415 A  *  11/1990  Bartha .............. H01L 21/28556
                                          257/E21.17
(Continued)

FOREIGN PATENT DOCUMENTS

CN         1853254 A    10/2006
CN       100337313 C    9/2007
(Continued)

OTHER PUBLICATIONS

First Office Action and Search Report for corresponding Chinese application No. 201780081151.6 dated Jun. 9, 2021.
(Continued)

*Primary Examiner* — Sylvia MacArthur
*Assistant Examiner* — Michelle Crowell
(74) *Attorney, Agent, or Firm* — Pearne & Gordon LLP

(57) ABSTRACT

In a capacitive coupled etch reactor, in which the smaller electrode is predominantly etched, the surface of the larger electrode is increased by a body e.g. a plate, which is on the same electric potential as the larger electrode and which is immersed in the plasma space. A pattern of openings in which plasma may burn is provided in the body so as to control the distribution of the etching effect on a substrate placed on the smaller electrode.

34 Claims, 10 Drawing Sheets

FIG. 1

(51) Int. Cl.
| | |
|---|---|
| C23C 16/46 | (2006.01) |
| C23C 14/35 | (2006.01) |
| C23C 16/44 | (2006.01) |
| H01L 21/263 | (2006.01) |
| H01L 21/3065 | (2006.01) |
| H01L 21/67 | (2006.01) |

(52) U.S. Cl.
CPC ...... *C23C 16/466* (2013.01); *H01J 37/32091* (2013.01); *H01J 37/32165* (2013.01); *H01J 37/32174* (2013.01); *H01J 37/32183* (2013.01); *H01J 37/32568* (2013.01); *H01J 37/32724* (2013.01); *H01J 37/32816* (2013.01); *H01L 21/2633* (2013.01); *H01L 21/3065* (2013.01); *H01L 21/67069* (2013.01); *H01J 2237/002* (2013.01); *H01J 2237/3341* (2013.01)

(56) References Cited

U.S. PATENT DOCUMENTS

| | | | |
|---|---|---|---|
| 5,006,192 A | 4/1991 | Deguchi | |
| 5,015,331 A * | 5/1991 | Powell | H01L 21/31116 204/298.34 |
| 5,846,375 A * | 12/1998 | Gilchrist | H01L 21/67109 156/345.52 |
| 5,882,414 A | 3/1999 | Fong et al. | |
| 5,892,207 A * | 4/1999 | Kawamura | C23C 16/46 219/492 |
| 6,248,219 B1 | 6/2001 | Wellerdieck et al. | |
| 7,988,815 B2 * | 8/2011 | Rauf | H01J 37/16 156/345.43 |
| 2001/0006093 A1 | 7/2001 | Tabuchi et al. | |
| 2003/0077910 A1 | 4/2003 | Westerman et al. | |
| 2005/0098265 A1 | 5/2005 | Fink et al. | |
| 2005/0167052 A1 | 8/2005 | Ishihara et al. | |
| 2006/0236932 A1 * | 10/2006 | Yokogawa | H01J 37/32623 118/723 E |
| 2007/0085483 A1 | 4/2007 | Ni et al. | |
| 2007/0284043 A1 * | 12/2007 | Tanaka | H01J 37/32522 156/345.28 |
| 2008/0011424 A1 | 1/2008 | Yin et al. | |
| 2008/0061041 A1 | 3/2008 | Nishijima | |
| 2008/0178805 A1 * | 7/2008 | Paterson | H01J 37/32357 118/723 I |
| 2008/0274297 A1 * | 11/2008 | Furuta | C23C 16/4585 427/569 |
| 2009/0025879 A1 | 1/2009 | Rauf et al. | |
| 2009/0090852 A1 * | 4/2009 | Chen | H05H 3/06 250/251 |
| 2009/0139453 A1 * | 6/2009 | Chen | H01J 37/32357 118/723 I |
| 2010/0101727 A1 * | 4/2010 | Ji | H01J 37/32357 156/345.29 |
| 2011/0049102 A1 * | 3/2011 | Kroll | H01J 37/32357 216/71 |
| 2011/0193402 A1 | 8/2011 | Yamamoto et al. | |
| 2011/0240222 A1 | 10/2011 | Sawada et al. | |
| 2012/0285935 A1 * | 11/2012 | Miyake | C23C 16/46 219/121.36 |
| 2013/0136872 A1 | 5/2013 | Booth et al. | |
| 2013/0228124 A1 * | 9/2013 | Furuta | H01J 37/32559 118/720 |
| 2013/0327481 A1 * | 12/2013 | Marakhtanov | H01J 37/32577 156/345.28 |
| 2014/0051253 A1 | 2/2014 | Guha | |
| 2014/0057387 A1 * | 2/2014 | Hwang | H01J 37/32422 118/620 |
| 2015/0170924 A1 * | 6/2015 | Nguyen | H01L 21/67069 438/710 |
| 2015/0262798 A1 | 9/2015 | Binns et al. | |
| 2016/0050781 A1 | 2/2016 | Kellogg et al. | |
| 2016/0163515 A1 * | 6/2016 | Maruyama | H01J 37/32816 438/714 |
| 2016/0276134 A1 * | 9/2016 | Collins | H01J 37/32357 |
| 2016/0293387 A1 | 10/2016 | Huh et al. | |
| 2018/0102259 A1 * | 4/2018 | Wang | H01J 37/32091 |
| 2019/0341234 A1 * | 11/2019 | Weichart | H01J 37/32568 |
| 2020/0312624 A1 * | 10/2020 | Weichart | C23C 14/35 |

FOREIGN PATENT DOCUMENTS

| | | | | |
|---|---|---|---|---|
| EP | 0 658 918 B1 | 8/1997 | | |
| EP | 1 215 710 A2 | 6/2002 | | |
| EP | 1780777 A1 | 5/2007 | | |
| GB | 2336850 A * | 11/1999 | | C23C 16/409 |
| JP | 2001508923 A | 7/2001 | | |
| JP | 2006-332704 A | 12/2006 | | |
| JP | 2008069382 A | 3/2008 | | |
| JP | 2010121159 A | 6/2010 | | |
| JP | 2010123689 A | 6/2010 | | |
| JP | 2011184034 A | 9/2011 | | |
| JP | 2013531368 A | 8/2013 | | |
| JP | 2001135626 A | 5/2018 | | |
| KR | 100523766 B1 | 10/2005 | | |
| KR | 20090012169 A | 2/2009 | | |
| TW | 423045 B | 2/2001 | | |
| TW | 511397 B | 11/2002 | | |
| TW | I231955 B | 5/2005 | | |
| TW | 201841202 A | 11/2018 | | |
| WO | 9832154 A1 | 7/1998 | | |
| WO | 00/00999 A1 | 1/2000 | | |
| WO | 2007/100528 A2 | 9/2007 | | |
| WO | 2011146108 A2 | 11/2011 | | |

OTHER PUBLICATIONS

Suzuki et al., Abstract of article "Analytical Investigation of Plasma and Electrode Potentials in a Diode Type Rf Discharge", The Japan Society of Applied Physics, 1986.
International Search Report for International Application No. PCT/EP2017/076506, dated Jan. 4, 2018.
Written Opinion for International Application No. PCT/EP2017/076506, dated Jan. 4, 2018.
Office Action for corresponding Japanese application No. 2019-528819 dated Sep. 21, 2021.
Translation of Office Action for corresponding Taiwanese application No. 106137945 dated Jan. 11, 2022.

* cited by examiner

RF CAPACITIVE COUPLED ETCH REACTOR

The present invention is directed to a two-electrode capacitive coupled RF etch reactor or apparatus and obeys substantially the law of Koenig as e.g. addressed in U.S. Pat. No. 6,248,219. In such a reactor or apparatus, the plasma space is in operational contact solely with an electrode arrangement which consists of a first electrode arrangement and of a second electrode arrangement facing the first electrode arrangement. The law of Koenig defines that the ratio of the drop of time averaged electrical potential adjacent to the electrode surfaces between which an Rf plasma discharge is generated, is given by the inverse ratio of respective electrode surface areas raised to the fourth power. The conditions for which the law of Koenig is valid are also addressed in the patent as mentioned. Therefrom results the skilled artisan's knowledge, that the smaller electrode surface exposed to the Rf plasma is predominantly sputtered off, in other words etched, the larger being predominantly sputter coated.

It is an object of the present invention to provide an improved etching reactor or apparatus of the addressed type.

This is achieved by a capacitive coupled RF vacuum etching apparatus constructed for etch operating under predetermined conditions, including predetermined pressure conditions. Such apparatus comprises a vacuum recipient—also addressed as enclosure—.

In the vacuum recipient, a plasma space is provided which is contact solely with one electrode arrangement consisting of a first electrode arrangement and of a second electrode arrangement facing the first electrode arrangement. Other members which are not electrically conductive or which are operated in an electrically floating manner may be in contact with the plasma space but are not to be considered as electrodes.

The fact, that the plasma is operated and influenced by only two electrodes is essential for a Koenig type reactor.

The first electrode arrangement defines a first electrode surface exposed to the plasma space.

The second electrode arrangement defines a second electrode surface exposed to the plasma space and comprises the surface of a workpiece carrier with a carrier surface.

The first electrode surface is larger than the second electrode surface.

The first electrode arrangement is electrically connected to and supplied from an output arrangement of a Rf generator arrangement via a match box arrangement.

The first electrode arrangement comprises a metal body with a surrounding surface freely exposed to and immersed in the plasma space whereby the surrounding surface is a part of the first electrode surface.

When we address that the surrounding surface of the body is freely exposed to the plasma space, it is clear that some minor and neglectable parts of that surface are not freely exposed but are necessarily used to establish a mechanical mount for the body within the plasma space.

By means of such a body the effective surface of the first electrode arrangement is significantly enlarged.

In one embodiment of the apparatus according to the invention the metal body comprises a pattern of through openings and/or through slits tailored so that, in operation, plasma burns in the through openings at the predetermined conditions.

By such trough openings and/or through slits plasma distribution in the plasma space may be controlled and thus the distribution of etching effect on the workpiece or substrate.

In one embodiment of the apparatus according to the invention the first electrode surface comprises a first surface area extending along a first plane, a second surface area of said body, extending along a second plane, said first and second surface areas defining an interspace tailored so that, in operation, plasma burns in and along the interspace at the predetermined conditions.

If such body is constructed and mounted to just form an interspace with a width just large enough to allow plasma to burn therein but not significantly larger, the effective surface of the first electrode becomes significantly enlarged without significantly increasing the overall volume of the plasma space and thus of the vacuum recipient.

In one embodiment of the apparatus according to the invention the second electrode surface comprises a surface area extending along a third plane and said first, second and third planes are parallel planes.

Thus, the reactor is, in one embodiment and principally, a parallel electrode reactor.

In one embodiment, the addressed metal body is a plate.

In one embodiment the capacitive coupled RF vacuum etching apparatus according to the invention the Rf generator arrangement generates at least one first plasmas supply signal at a very high frequency at the output arrangement and at least one second plasma supply signal at a high frequency lower than the very high frequency at the output arrangement and the first electrode arrangement is electrically connected via a match box arrangement to the output arrangement and is electrically supplied, in operation, by the first and by the second plasma supply signals.

The second electrode arrangement is, at least during etching operation, electrically connected to a system ground tab.

Due to the dual—or even multiple—Rf-frequency supply of the plasma in the plasma space, the plasma density and thus etching efficiency is significantly increased.

Nevertheless, the overall construction of the reactor or apparatus is significantly facilitated by the fact that only the first electrode arrangement is multiple Rf supplied and provided with a match box arrangement, whereas the second electrode arrangement is kept on electrical ground potential. As it is this second electrode arrangement which provides for the workpiece support, the construction of workpiece handling equipment is thereby substantially simplified as well.

In one embodiment of the apparatus according to the invention the first plasma supply signal and the second plasma supply signal are connected, via the match box arrangement, to the first electrode arrangement at locally different contact points.

In one embodiment of the apparatus according to the invention the Rf generator arrangement is connected, via the match box arrangement, to the first electrode arrangement at more than one locally different contact points.

Both embodiments just addressed may improve plasma distribution in the plasma space and, especially for etching large workpieces or substrates, may contribute to reducing the occurrence of standing waves.

In the embodiments of the apparatus according to the invention, in which, as was addressed, at least a first very high frequency and a second high frequency supply signal are applied to the first electrode arrangement, in one embodiment there is valid:

$$10 \text{ MHz} \leq f_{vhf} \leq 400 \text{ MHz},$$

or $$10 \text{ MHz} \leq f_{vhf} \leq 300 \text{ MHz}$$

or $$20 \text{ MHz} \leq f_{vhf} \leq 300 \text{ MHz}$$

or $$20 \text{ MHz} \leq f_{vhf} \leq 100 \text{ MHz}$$

and:

$$0.01 \, f_{vhf} \leq f_{hf} \leq 0.5 \, f_{vhf}$$

or $$0.05 \, f_{vhf} \leq f_{hf} \leq 0.5 \, f_{vhf}.$$

Thereby $f_{hf}$ stands for the frequency of the high frequency supply signal and $f_{vhf}$ stands for the frequency of the very high frequency supply signal.

In one embodiment of the apparatus according to the invention the workpiece carrier is drivingly movable towards and from the first electrode arrangement.

In one embodiment of the apparatus according to the invention the workpiece carrier is not movable towards and from the first electrode arrangement.

In one embodiment of the apparatus according to the invention the workpiece carrier is not movable towards and from the first electrode arrangement and the first electrode arrangement comprises a drivingly movable door for loading/unloading a workpiece.

In one embodiment of the apparatus according to the invention the enclosure is subdivided in a pumping compartment comprising a pumping port and in an etching compartment comprising the first electrode arrangement. The compartments are separate by a shroud or rim which has a pattern of through openings and/or through slits tailored so that, in operation, plasma does not burn therein at the predetermined etching conditions.

Such two-compartment structure allows to realize high pumping efficiency through a large pumping port although keeping the etching compartment small, just adapted to the specific workpiece or substrate and the electrode arrangements. The etching compartment volume may be fully exploited for the electrode arrangements without considering pumping port requirements.

In one embodiment of the apparatus according to the invention the enclosure is subdivided in a pumping compartment which comprises a pumping port and in an etching compartment, which comprises the first electrode arrangement. The compartments are separate by a shroud or rim. The shroud or rim holds a frame which defines a workpiece access opening to the etching compartment. The frame is held by the shroud or rim by means of a multitude of spokes which mutually define through-gaps between the pumping compartment and the etching compartment. The gaps are tailored so that, in operation, plasma does not burn therein. In a further embodiment, the frame is thereby held by the rim or shroud by means of the spokes in such a manner, that the frame may freely expand and retract under thermal loading.

In one embodiment of the apparatus according to the invention the enclosure is again subdivided in a pumping compartment comprising a pumping port and an etching compartment comprising the first electrode arrangement. The compartments are separate by a shroud or rim having a pattern of through openings or through slits tailored so, that, in operation, plasma does not burn therein at the predetermined etching conditions. The shroud or rim holds a frame which defines a workpiece access opening to the etching compartment. The workpiece carrier is drivingly movable from a load-/unload position into a processing position and vice versa. The frame acts as a downholding member for a workpiece or substrate on the workpiece carrier in the processing position.

The skilled artisan knows as to when a vacuum plasma will burn or will not burn in a void e.g. in a hole, in a slit in an interspace, when predetermined processing conditions are applied.

In one embodiment of the apparatus according to the invention the enclosure is again subdivided in a pumping compartment comprising a pumping port and in an etching compartment which comprises the first electrode arrangement. The compartments are separate by a shroud or rim. The shroud or rim holds a frame which defines a workpiece access opening to the etching compartment. The workpiece carrier is drivingly movable from a load-/unload position into a processing position and vice versa. The frame is constructed so as to act as a downholding member for a workpiece or substrate on the workpiece carrier in the processing position. The shroud or rim holds the frame by means of a multitude of spokes mutually defining through-gaps between the pumping and the etching compartments. The through-gaps are tailored so, that, in operation, plasma does not burn therein at the predetermined etching conditions. The frame is held by the rim or shroud by means of the spokes so that it may freely expand and retract under thermal loading.

In one embodiment of the apparatus according to the invention the spokes are constructed as compressible and/or bendable members and thus resiliently allow free expansion and retraction of the frame.

In one embodiment of the apparatus according to the invention at least a part of the spokes define a direction of length extent each and are mounted to the frame so, that the respective direction of length extent intersects the tangent on said frame at the locus of respective spoke fixation with an angle $\alpha$ for which there is valid:

$$90° > \alpha \geq 0°.$$

In one embodiment of the apparatus according to the invention the workpiece carrier comprises a channel arrangement adapted to receive a liquid heating or cooling medium.

In one embodiment of the apparatus according to the invention the enclosure is subdivided in a pumping compartment comprising a pumping port and an etching compartment comprising the first electrode arrangement. The compartments are separate by a shroud or rim which has a pattern of through openings and/or through slits tailored so that, in operation, plasma does not burn therein at the predetermined etching conditions. The workpiece carrier is drivingly movable from a load-/unload position into a processing position and vice versa. A downholding member is provided tailored to mechanically hold a workpiece or substrate down on the workpiece carrier and in the processing position at and along the periphery of the workpiece- or substrate-surface which is exposed to the etching compartment. The workpiece carrier comprises a channel arrangement adapted to receive a liquid heating or cooling medium and a further channel arrangement adapted to receive a heat conduction gas. The further channel arrangement discharges by a bore- or slit-pattern at the carrier-surface of the workpiece carrier.

In one embodiment of the apparatus according to the invention the further channel arrangement and bores or slits discharging at the carrier-surface are tailored so as to establish along the periphery of an interspace between said carrier-surface and a substrate or workpiece a pressure of heat conducting gas which is at least equal to the pressure in the and along the more central parts of said interspace.

In one embodiment of the apparatus according to the invention the enclosure is subdivided in a pumping compartment comprising a pumping port and in an etching compartment comprising the first electrode arrangement. The compartments are separate by a shroud or rim having a pattern of through openings and/or through slits which are tailored so that, in operation, plasma does not burn therein at said predetermined etching conditions. The shroud or rim is either a part of the enclosure or comprises a part of the enclosure and a part of the first electrode arrangement.

In one embodiment of the apparatus according to the invention the enclosure is subdivided in a pumping compartment comprising a pumping port and in an etching compartment comprising the first electrode arrangement. The compartments are separate by a shroud or rim which has a pattern of through openings and/or through slits. As was addressed bevor in different contexts, these openings and/or through slits are tailored so that, in operation, plasma is not burn therein at the predetermined etching conditions. The workpiece carrier is drivingly movable from a load-/unload position into a processing position and vice versa. The shroud or rim is electrically connected to the workpiece support in its processing position by distinct, distributed and resilient contact members.

In one embodiment of the apparatus according to the invention the Rf generator arrangement generates, as was addressed above, at least one first plasmas supply signal at a very high frequency at an output arrangement and—simultaneously—at least one second plasma supply signal at a high frequency lower than said very high frequency, at the output arrangement. The first electrode arrangement is electrically connected via a match box arrangement to the output arrangement and is electrically supplied, in operation, by the first and by the second plasma supply signals. The second electrode arrangement is electrically connected to a system ground tab and the frequency of first plasma supply signal is about 60 MHz, the frequency of the second plasma supply signal about 13 Mhz.

Please note that in all embodiments in which a very high frequency supply signal as well as a high frequency supply signal are applied to the first electrode arrangement these at least two supply signals are simultaneously applied at least during time intervals of the etching operation.

In one embodiment of the apparatus according to the invention the predetermined pressure condition for the etching is between 0.1 and 0.5 Pa, both limits included.

In one embodiment of the apparatus according to the invention a spacing between a first part of the surrounding surface of the metal body freely exposed to and immersed in the plasma space and a second part of the first electrode surface, facing the first part, is 10 mm to 40 mm, preferably 20 mm.

In one embodiment of the apparatus according to the invention, a spacing between a predominant part of the first electrode surface facing the workpiece carrier and a predominant part of the surface of the workpiece carrier is 40 mm to 80 mm, both limits included, is preferably 65 mm.

One embodiment of the apparatus according to the invention is shaped for rectangular or square substrates.

In one embodiment of the apparatus according to the invention the Rf generator arrangement is constructed to at least one of frequency modulating and of power modulating at least one RF supply signal during operation.

In one embodiment of the apparatus according to the invention at least one of the following features prevails:

The Rf generator arrangement is tailored to supply a very high frequency supply signal and high frequency supply signal to the first electrode arrangement, the frequency of the very high frequency supply signal being an integer multiple of the frequency of the high frequency supply signal;

The Rf generator arrangement is tailored to supply a very high frequency supply signal and high frequency supply signal to the first electrode arrangement and to phase lock the addressed supply signals;

The Rf generator arrangement is tailored to supply a very high frequency supply signal and high frequency supply signal to the first electrode arrangement and for adjusting mutual phasing of the addressed supply signals;

The Rf generator arrangement is tailored to supply a very high frequency supply signal and high frequency supply signal to the first electrode arrangement and to vary mutual phasing of the addressed supply signals during operation.

The invention is further directed on a workpiece or substrate processing plant comprising at least one capacitive coupled Rf apparatus according to the invention or one or more than one of its embodiments. In one embodiment, the plant is an inline plant, including a coil-to-coil foil processing plant. In an inline plant, workpieces are transported in a row from one treatment station to the next at a fixed rhythm. In a further embodiment, the plant is of the type in which the treatment stations are loaded and unloaded with at least one workpiece or substrate at a selectable rhythm, as by a handler, e.g. a central handler.

The invention is further directed to a method of etching workpieces or substrates or of manufacturing etched workpieces or substrates by making use of the capacitive coupled RF vacuum etching apparatus according to the invention or according to one or more than one of its embodiments, or of the plant according to the invention.

In one variant of the method according to the invention etching is performed in a reactive gas atmosphere, preferably containing oxygen or oxygen and fluorine. Thereby oxygen as well as fluorine may be provided by a gas containing oxygen, oxygen e.g. by N2O and, respectively fluorine, by a gas containing fluorine, as e.g. by CF4, SF6, NF3, C4F8 etc.

One or more than one of the embodiments of the capacitive coupled RF vacuum apparatus may be combined, if not contradictory.

The invention will now be further described by examples and with the help of figures.

We address throughout the present description and claims a frequency f as a very high frequency $f_{vhf}$ if there is valid:

$$10\ MHz \leq f_{vhf} \leq 400\ MHz,$$

or $$10\ MHz \leq f_{vhf} \leq 300\ MHz$$

or $$20\ MHz \leq f_{vhf} \leq 300\ MHz$$

or $$20\ MHz \leq f_{vhf} \leq 100\ MHz.$$

We address throughout the present description and claims a frequency f as a high frequency $f_{hf}$ if there is valid:

$$0.01\ f_{vhf} \leq f_{hf} \leq 0.5\ f_{vhf}$$

or $$0.05\ f_{vhf} \leq f_{hf} \leq 0.5\ f_{vhf}.$$

Figure 1:
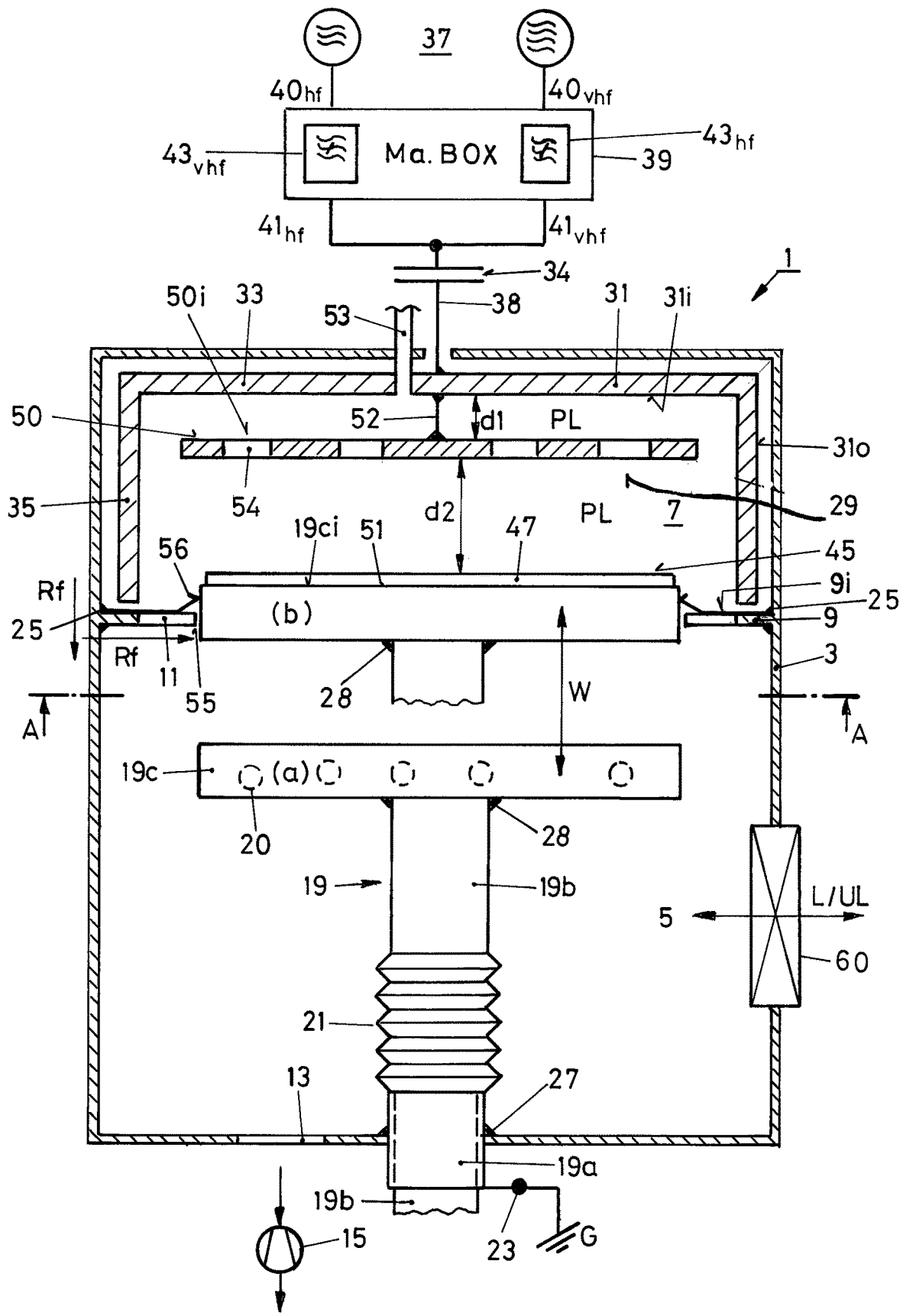
FIG. 1 most schematically and simplified an embodiment of the apparatus according to the present invention.

The apparatus 1 of the embodiment of FIG. 1 and according to the invention, which will also be called reactor, comprises a vacuum chamber within a metal enclosure 3. Within the enclosure 3 a pumping compartment 5 is separate from an etching compartment 7 by a separating shroud or rim 9 having a dense pattern of through—holes and/or through—slits 11. The lower compartment, the pumping compartment 5, comprises a large pumping port 13 to which a pump arrangement 15 is connectable.

A metal workpiece support, also called substrate support, 19 has a first metal part 19a rigidly mounted and electrically connected to the metal enclosure 3 and a movable part 19b drivingly movable up and down, as shown by the double arrow W, with respect to the part 19a. The movable part 19b carries a metal workpiece- or substrate-carrier 19c. The drive for the parts 19b and 19c is not shown in FIG. 1.

The part 19c is, especially in its edging, upper position, electrically linked to ground e.g. via a metal bellow 21 to part 19a.

As schematically shown, the metal enclosure 3 is electrically connectable to a system ground-G-connector as e.g. shown in FIG. 1 at 23.

The enclosure 3 is further electrically connected to shroud or rim 9 e.g. at 25 and is electrically connected to part 19a e.g. at 27. Part 19b is electrically connected to substrate carrier 19c e.g. at 28.

Within the etching compartment 7 there is provided a first electrode arrangement 29. The first electrode arrangement 29 which provides for the larger electrode surface of the reactor 1, thus the electrode surface being predominantly sputter coated, comprises a jar- or pot-shaped electrode body 31 with a plate shaped basis 33 and frame like side walls 35. The jar- or pot-shaped electrode body 31 resides close to and separate from and along the enclosure 3. It may e.g. be mounted to the enclosure 3 via an electrically isolating layer or by electrically isolating members (not shown).

The first electrode arrangement 29 is electrically connected to a supply generator arrangement 37, as shown by line 38, via a matchbox arrangement 39. Thereby the basis 33 of the electrode body 31 is, e.g. substantially centrally, connected to—according to one embodiment of the invention—at least two outputs $41_{vhf}$ and $41_{hf}$ of an output arrangement of the matchbox arrangement 39. From the output $41_{vhf}$ a first plasma supply signal with a $f_{vhf}$ frequency supplies the first electrode arrangement 29 and, from output $41_{hf}$ a second plasma supply signal with a frequency $f_{hf}$, superimposed on the first plasma supply signal, supplies the first electrode arrangement 29. The first and second plasma supply signals are generated by the supply generator arrangement 37, e.g. comprising a generator for the first plasma supply signal and a second generator for the second plasma supply signal. The generator arrangement 37 has an output $40_{vhf}$ as well as an output $40_{hf}$ to the matchbox.

The first and second plasma supply signals are simultaneously applied—superimposed—to the first electrode arrangement 29, at least during a time interval within etch processing timespan, thereby even during a predominant time interval within the etch processing timespan, or even during the entire etch processing timespan.

The match box arrangement 39 is constructed to prevent that, due to superposition of the plasma supply signals, the vhf plasma supply signal loads the hf generator output and vice versa. As schematically shown in FIG. 1 a band block filter 43$_{vhf}$ tuned on the f$_{vhf}$ generated at the output 40$_{vhf}$ blocks signals from the output 40$_{vhf}$ to load the output 40$_{hf}$. In analogy, a band block filter 43$_{hf}$ tuned on the f$_{hf}$ generated at the output 40$_{hf}$ blocks signals from the output 40$_{hf}$ to load the output 40$_{vhf}$. This is equivalent to supplying the electrode arrangement 29, respectively, via band-pass filters.

The second electrode arrangement 45 comprises the workpiece carrier 19c of the workpiece support 19 in its lifted-up position (b), which is the etching position for a plate shaped workpiece or substrate residing on the workpiece carrier 19c.

As addressed above, the workpiece carrier 19c is on system ground potential. This significantly simplifies overall construction of the reactor, e.g. with an eye on handling substrates to and from the reactor. As the substrate is therefore operated on ground potential, the electrode arrangement 29 is operated on a floating DC potential e.g. in that it is—normally in the matchbox arrangement 39—decoupled from DC as by capacitive coupling to the supply generator arrangement 37, as schematically shown by capacitor 34.

Generically spoken, and in this embodiment, the larger electrode is supplied by different Rf frequencies and the substrate carrier, the smaller electrode, is operated on ground potential.

The shroud 9, operated on ground potential, is, electrically, part of the second electrode arrangement 45. The RF plasma PL is confined between the inner surface 31i of the electrode body 31, the upper surface 9i of the shroud 9 and the surface 19ci of the workpiece carrier 19c exposed to the etching compartment 7.

Between the outer surface 310 of the electrode body 31 and the enclosure 3 no plasma is generated, due to the fact that the interspace between the enclosure 3 and the outer surface 310 of the electrode body 31 is respectively conceived e.g. so, that the spacing is smaller than dark space distance at the predetermined operating etching conditions or e.g. due to the fact that the respective interspace is filled with a dielectric material spacing layer.

The through—openings or through slits 11 in the shroud 9 are dimensioned so small, that no plasma may burn therein at the addressed conditions. Through slits are narrower than the addressed dark space distance. The diameters of through holes as well are smaller than the addressed dark space distance. Nevertheless, the density of through bores or through slits is high enough to ensure a very low gas flow resistance from the etching compartment 7 to the pumping compartment 5, ensuring a highly efficient pumping-off of etched off material. As the through-bores or -slits 11 in the shroud 9 are dimensioned so that no plasma may burn therein, the surface increase of the second electrode arrangement 45 by such bores and/or slits does not influence sputtering/etching distribution between the electrode arrangements 29 and 45.

The etching efficiency of a substrate 47 is significantly improved by substantially enlarging the electrode surface of the first electrode arrangement 29. This is realized by providing at least one metal body 50 e.g. plate shaped, distant from the surface 31i of the electrode body 31. The e.g. plate shaped, metal body 50 has an overall surrounding surface 50i, which, with the exception of some small areas for mounting and electrically feeding the body 50, is freely exposed to the plasma space PL. Electrically RF-supplied e.g. by both plasma supply signals, as schematically shown at 52 and spaced from the surface 31i by a distance d1 larger than the dark space distance at the prevailing conditions for the etching process for the substrate 47, the e.g. plate shaped body 50 becomes completely immersed in the Rf plasma. Its overall surface 50i is part of the electrode surface of the first electrode arrangement 29.

Thus according to the invention, a metal body is immersed in the plasma space and at the Rf electric potential of the larger electrode arrangement in a reactor substantially obeying the law of Koenig.

By means of a selected pattern of through openings and/or through slits 54, dimensioned to allow plasma burning there through, the etch-rate distribution along the workpiece or substrate 47 may be adjusted, e.g. for dealing with border effects which may affect this distribution along the periphery of the substrate 47. To do so it is proposed to provide an increased density of through openings along and in vicinity of a substantial extent-parts of the periphery of the plate shaped body 50 and/or to provide extended slits along and in vicinity of the addressed peripheral parts.

Blurring or picturing the through holes or through slits 54 in the plate shaped body 50 on the etch-rate distribution on the substrate 47 may be minimized by appropriately selecting the distance d2 between the surface of the substrate 47 to be etched and the surface of the plate shaped body 50 large enough. In a good embodiment of the reactor 1, the addressed through slits 54 are realized comprising or even consisting of elongated slits along the periphery of the plate shaped body 50, neighboring the side wall 35 of the electrode body 31.

So as to minimize Rf return impedance to system ground G, the shroud or rim 9 electrically contacts the workpiece carrier 19c e.g. by resilient contact members 56 e.g. distributed all along the circumference of the workpiece—or substrate carrier 19c. Thereby in the embodiment of FIG. 1 Rf current is led in parallel along the enclosure 3 and along the workpiece support 19 to the system ground G.

Gas, especially just an inert working gas as e.g. Ar, is fed by a gas feed line 53 into the plasma space PL. The reactor 1 may also be used for reactive plasma etching e.g. in an oxygen or oxygen plus fluorine containing atmosphere. In this case also the respective reactive gas or gas mixture is fed through a respective gas feed line to the plasma space.

Due to the fact, that a powerful pump arrangement 15 may be connected to the large pumping port 13 in the separate pumping compartment 5, which may be dimensioned completely independently from dimensioning of the etching compartment 7 with the respective surface extent conditions for the first and second electrode arrangements 29,45, and due to the fact that the plasma space PL is in gas-flow (not plasma) connection through a dense pattern of through openings or through slits 11 in the shroud 9, a highly effective pumping removal of etched off material from the etching compartment 7 is achieved.

It is to be noted, that in the frame of the present invention, the substrate carrier 19c needs not be movable up and down towards and from the electrode arrangement 29 but may be provided stationary e.g. in the up position shown in FIG. 1 at (b).

Figure 2:
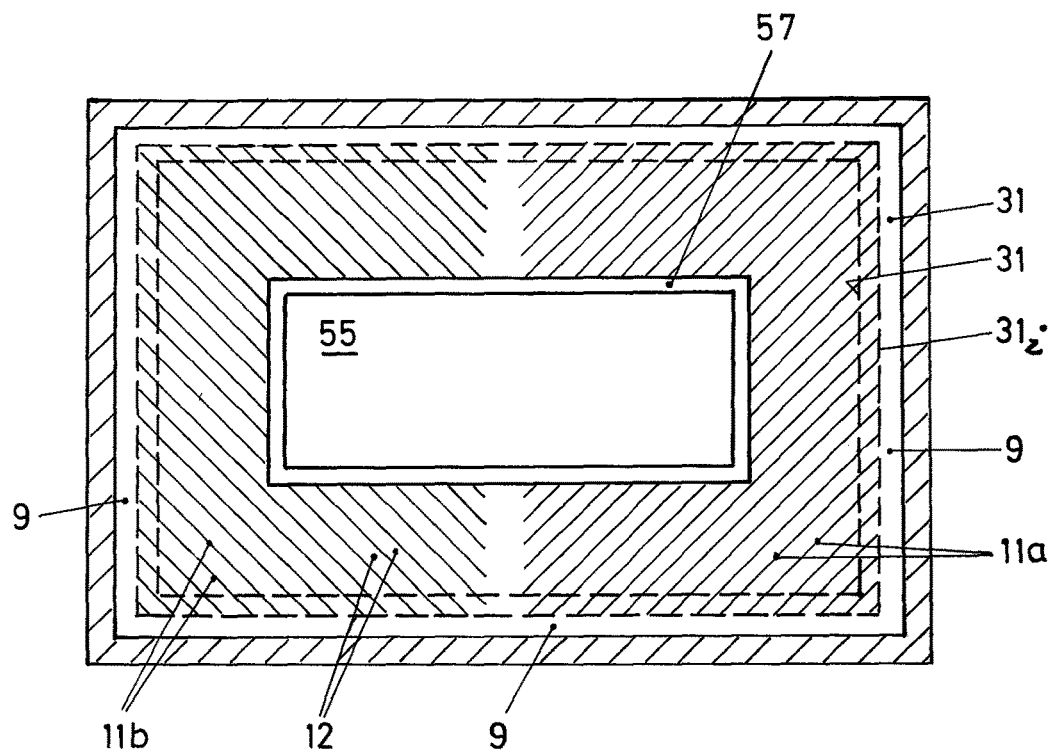
FIG. 2 again schematically and simplified, an embodiment of the apparatus according to the invention and according to a view on the embodiment of FIG. 1, seen from A-A in FIG. 1.
Figure 3:
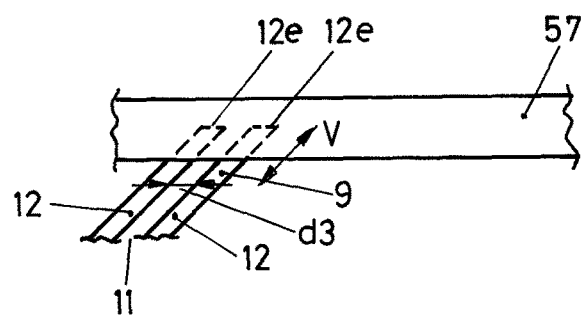
FIG. 3 schematically and simplified the link of the spokes to the frame of the embodiment of FIG. 2 in a perspective view.

FIG. 2 shows, again schematically and simplified, an example of the view through the embodiment of FIG. 1, seen from A-A of FIG. 1. The substrates to be etched are assumed rectangular or square. Thus, the shroud 9 frames the rectangular or square shaped handling opening 55 (FIG. 1) to which the substrate carrier 19c is lifted into etching position (in FIG. 1 (b)) or lowered towards substrate loading position (in FIG. 1 (a)). The shroud or rim 9 is a metal plate comprising a dense pattern of through slits between spokes 12. According to this example, in one half of the shroud plate 11 the slits 11 extend substantially in the direction of the one diagonal of the rectangular or square shroud, in the other half of the shroud or rim 9 in the direction of the other diagonal. The respectively directed slits are addressed in FIG. 2 by 11a and 11b. There where the spokes 12 defining the slits 11 abut in the handling opening 55 there ends 12e are free as shown in FIG. 3, freely supported in a ceramic material frame 57. The slits are machined in the plate shaped shroud 9.

Due to the fact that, in this example, the ends 12e of the spokes 12 are free to expand relatively to the frame 57 as addressed by the double arrow V in FIG. 3, the parts of shroud 9 and the frame 57, most exposed to thermal loading by the Rf etching process, may freely expand relative to one another, avoiding warpage of the shroud plate 9 and/or stressing, warping and possibly slightly displacing the ceramic material frame 57.

The ratio of solid material surface to open space surface of the slits 11 is about 1:1 and the width d3 of the slits is between 3 mm and 10 mm.

Figure 4:
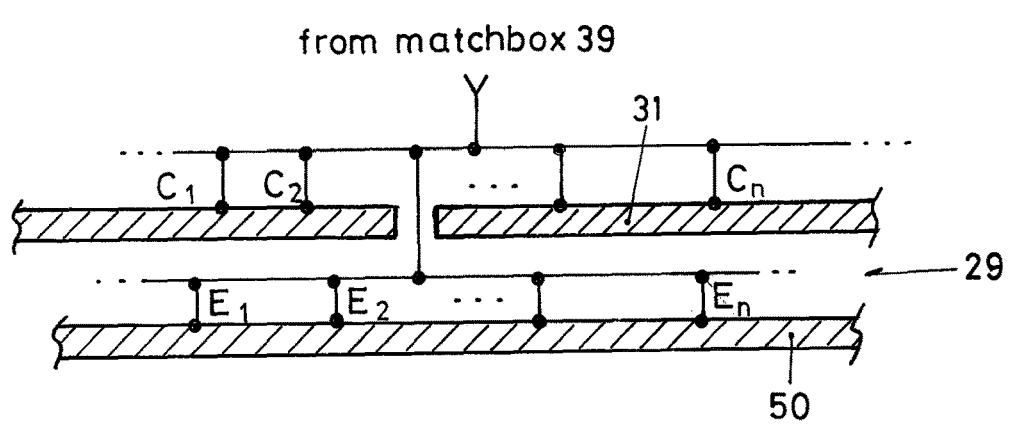
FIG. 4: schematically and simplified, an Rf supply of superimposed supply signals to the first electrode arrangement, according to an embodiment of the apparatus according to the invention.

Good operating parameters as used today:
Ar operating pressure: 0.1 to 0.5 Pa
$f_{vhf}$: 60 MHz
$f_{hf}$: 13.56 MHz
Power vhf supply signal<power of hf supply signal.
d1: larger than dark space distance at the addressed operating conditions: d1≥20 mm
d2: larger than dark space distance at the addressed operating conditions: d2≥65 mm As schematically shown in FIG. 4 the superimposed vhf and hf plasma supply signals may be fed to the first electrode arrangement 29 at locally different contact points, C1 to Cn at the jar shaped electrode body 31 and/or at contact points E1 to En to metal body 50.

Figure 5:
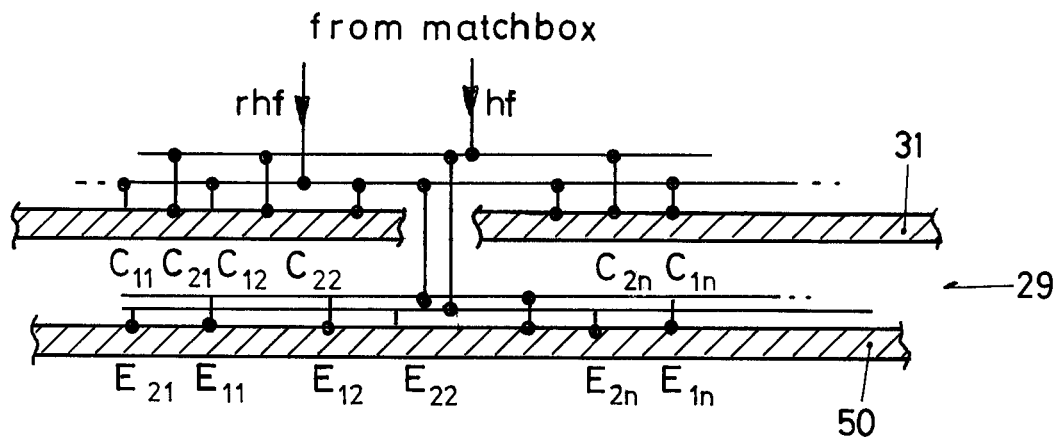
FIG. 5: schematically and simplified, an Rf supply of supply signals to the first electrode arrangement, according to an embodiment of the apparatus according to the invention.

As schematically shown in FIG. 5, the vhf plasma supply signal and the hf plasma supply signal may thereby be supplied separately to the first electrode arrangement 29, electrode body 31 and/or metal body 50, at respectively one or more than one locally different points C11 to C1n and/or E11 to E1n for the vhf supply signal and C21 to C2n and/or E21 to E2n for the hf supply signal. Only one C1x and/or E1x and/or only one C2x and/or E2x contacting points are possible as well.

The electrode body 31 and/or the metal body 50 may be subdivided in mutually electrically isolated segments, each supplied with at least one of the first and second plasma supply signals.

The Rf generator arrangement may further generate as a vhf first plasma supply signal a signal which may be frequency modulated during etch operation with respect to $f_{vhf}$ and/or which may be power modulated. Additionally, or alternatively the generator arrangement may generate as a hf second plasma supply signal a signal which may be frequency modulated during etch operation with respect to $f_{hf}$, or which may be power modulated.

The selected $f_{vhf}$ may further be an integer multiple of the $f_{hf}$, phase locked or not phase locked and possibly with adjustable, possibly time varying mutual phasing. More than one second plasma supply signals at different $f_{hf}$ may be applied in superimposed manner to the first electrode arrangement 29.

Figure 6:
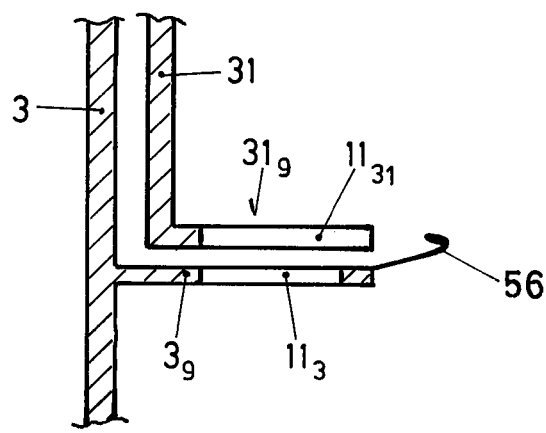
FIG. 6: schematically and simplified, a part of the rim or shroud of an embodiment of the apparatus according to the invention.

As schematically shown in FIG. 6 the first electrode surface 31i may further be increased by realizing an upper part of the shroud or rim 9 by a respective part 319 of the electrode body 31 and by spieling the bottom surface of the part 319 by a shield part $3_9$ of the enclosure 3, defining an interspace to the part 319 narrower than dark space distance at the intended etching conditions. Both, part 319 and $3_9$ have aligned through openings or through slits $11_{31}$ and $11_3$ respectively. Clearly the first electrode surface may further be significantly enlarged by shaping the plate shaped body 50 similar to body 31 jar- or pot-like and/or by providing more than one of the metal bodies 50 e.g. plate shaped and staggered by more than dark space distance.

In the embodiment of FIG. 1 the workpiece carrier 19c is dynamically operated i.e. movable up and down. In its low handling position, it is loaded with a workpiece or substrate to be etched and an etch treated workpiece or substrate is unloaded e.g. through a bidirectional load-lock 60. The workpiece carrier 19c is moved from handling position (a) up into etching position (b) for a substrate to be etch treated and from etching position (b) down into handling position (a) to unload the etch treated substrate.

Figure 7:
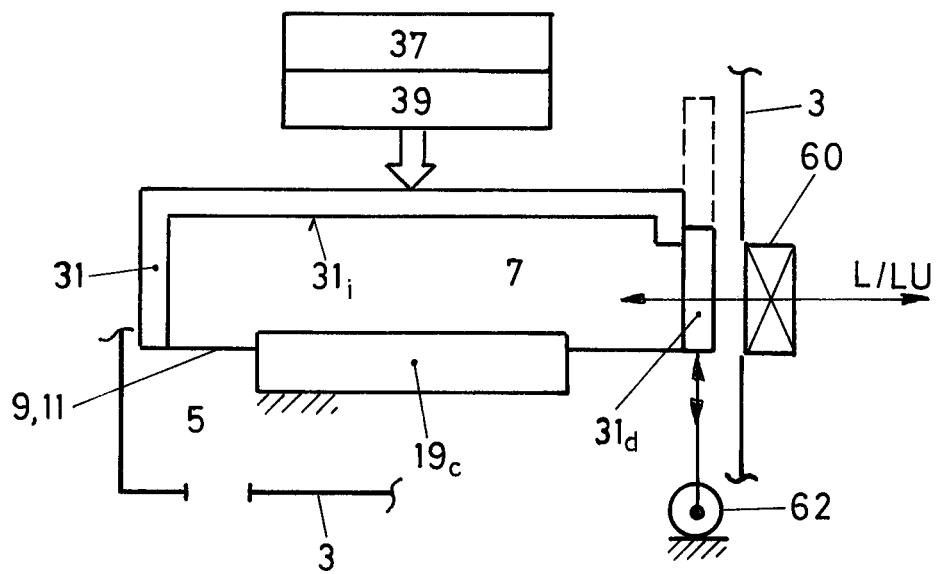
FIG. 7: schematically and simplified, an embodiment of the apparatus according to the present invention, in which the substrate—or workpiece—carrier is not lifted towards or retracted from the first electrode arrangement.

In FIG. 7, most schematically and simplified, an embodiment is shown where the workpiece or substrate carrier 19c is stationary i.e. is not movable towards and from the first electrode arrangement. The electrode body 31 may comprises a door 31d which may be opened and closed e.g. by a drive 62. In closed position, the door may be a part of the electrode body 31 and still contributes to the inner surface 31i. The workpiece or substrate is loaded on and unloaded from the workpiece or substrate carrier 19c e.g. via bidirectional load-lock 60.

The workpiece or substrate carrier may also be handled with a respective substrate or workpiece trough the loadlock 60 and is thus in any case not liftable towards and retractable from the first electrode arrangement 31.

Alternatively, the substrate or workpiece, with or without the workpiece or substrate carrier, may be loaded and unloaded pathing below the first electrode arrangement with the jar- or pot-like body 31 without providing a door as of door 31d in the body 31.

Figure 8:
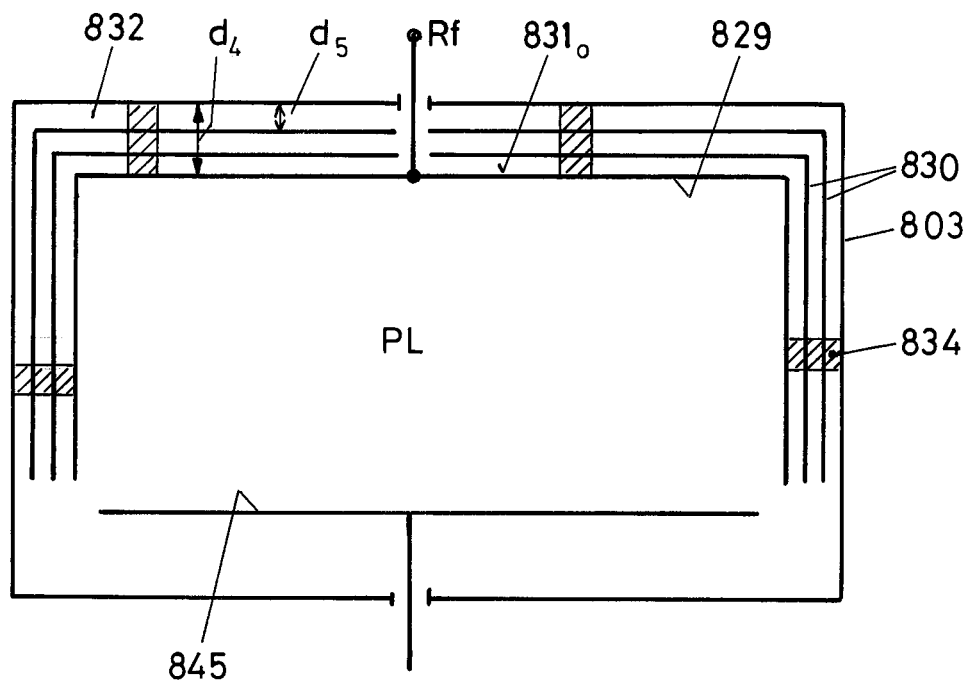
FIG. 8: most simplified and schematically, an embodiment of the apparatus according to the present invention.

In FIG. 8 there is shown, most simplified and schematically, an capacitive coupled RF vacuum etching apparatus obeying the law of Koenig. The Rf plasma space is confined between a first, larger electrode arrangement 829 and a second, smaller electrode arrangement 845. The first, larger electrode arrangement is operated with a Rf drive signal with at least one frequency and with respect to the metal enclosure 803 on a reference potential, e.g. on ground potential. Thus, there exists, in operation, a Rf potential difference between the metal enclosure 803 and the larger electrode arrangement 829. The spacing d4 between the outer surface $831_o$ of the electrode arrangement 829 and the inner surface of the enclosure 803 wall is decisive for the Rf power loss from the electrode arrangement 829 to the enclosure 803. To minimize such Rf loss, d4 should be selected as large as possible, minimizing the capacitance between the addressed surfaces, defining the interspace 832. On the other hand, plasma generation in the addressed interspace 832 is to be excluded, which requires d4 to be smaller than dark space distance at the prevailing etching conditions.

To resolve this problem, one or more than one electrically floating metal screens 830 are provided in the interspace 832, all along the surface 831o and the inner surface of the metal enclosure 803. By such floating screens, the capacitance between the addressed surfaces is kept small but no plasma may ignite in the interspace 832, due to the spacings d5 between neighboring surfaces of the screens or screens and the surface $831_o$ as well as the inner surface of the metal enclosure 803, respectively, being kept smaller than the dark space distance. The screens 830 may be mounted by means of electrically isolating distance holders 834 as schematically shown in FIG. 8.

The aspect explained by FIG. 8 is to minimize Rf power loss through an interspace from a large Rf operated electrode to the surrounding metal enclosure of a vacuum process recipient and thereby avoiding Rf plasma generation in such interspace by providing one or more than one metal screens along and in the interspace and mounted in an electrically floating manner. All sub interspaces between such screens and between such screens, the electrode surface and the metal enclosure surface, are narrower than dark space distance at the processing parameters of the process to be operated in the vacuum enclosure. This aspect is considered possibly inventive per se.

Figure 9:
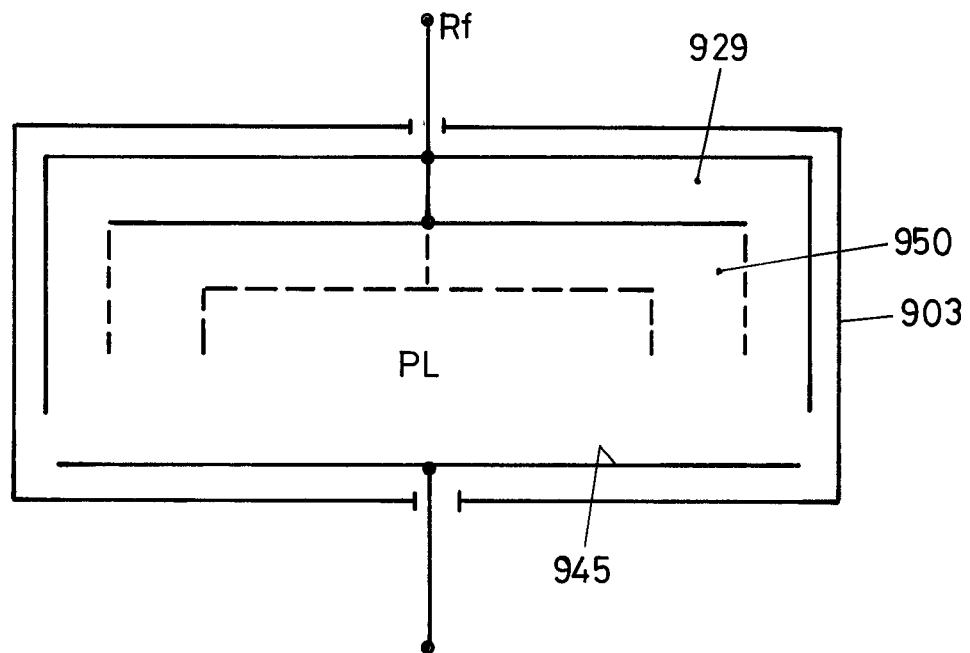
FIG. 9: schematically and simplified the feature of enlarging the effective surface of the first electrode arrangement at an embodiment of the apparatus according to the present invention.

In FIG. 9 there is shown, most simplified and schematically, the measures according to the invention, to enlarge the effective surface of the first electrode arrangement of the capacitive coupled RF vacuum etching apparatus according to the invention, which obeys the law of Koenig.

Figure 10:
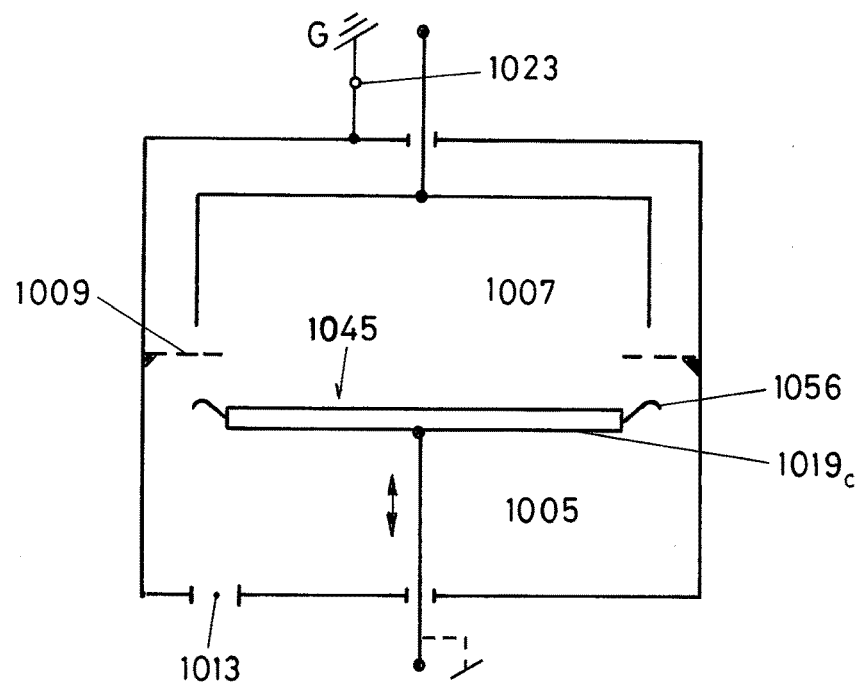
FIG. 10: schematically and simplified one variant of connecting the second electrode arrangement of an embodiment the apparatus according to the invention to ground potential.

The Rf plasma reaction space PL is confined between the larger first electrode arrangement 929 and the second, smaller electrode arrangement 945 in the vacuum enclosure 903. The electrode arrangements 929, 945 are fed with respect to one another by an Rf supply of one or more than one frequency. The surface of the first, larger electrode arrangement 829 is significantly enlarged, by providing at the electrode arrangement 929, at least one metal body 950, e.g. plate shaped or jar-shaped and immersed in the plasma reaction space PL and operated on the electric potential of the remainder of the electrode arrangement 929. FIG. 10 shows, simplified and schematically the capacitive coupled RF vacuum etching apparatus which, similar to the embodiment of FIG. 1, comprises a pumping compartment 1005 with a large pumping port 1013 and an etching compartment 1007. Similar to the embodiment of FIG. 1 the second, smaller electrode arrangement 1045, comprising the workpiece carrier 1019c is operated on ground potential and electrically contacts the shroud 1009 with the pumping trough bores and/or trough slits (not shown in FIG. 10) once lifted in etching position by distributed resilient contact members 1056. As the shroud 1009 is electrically connected to the metal enclosure 1003, similarly to shroud 9 in FIG. 1 to enclosure 3, and the enclosure 1003 is operated on electric ground potential, the workpiece carrier 1019c as well becomes tightly connected to ground potential.

Figure 11:
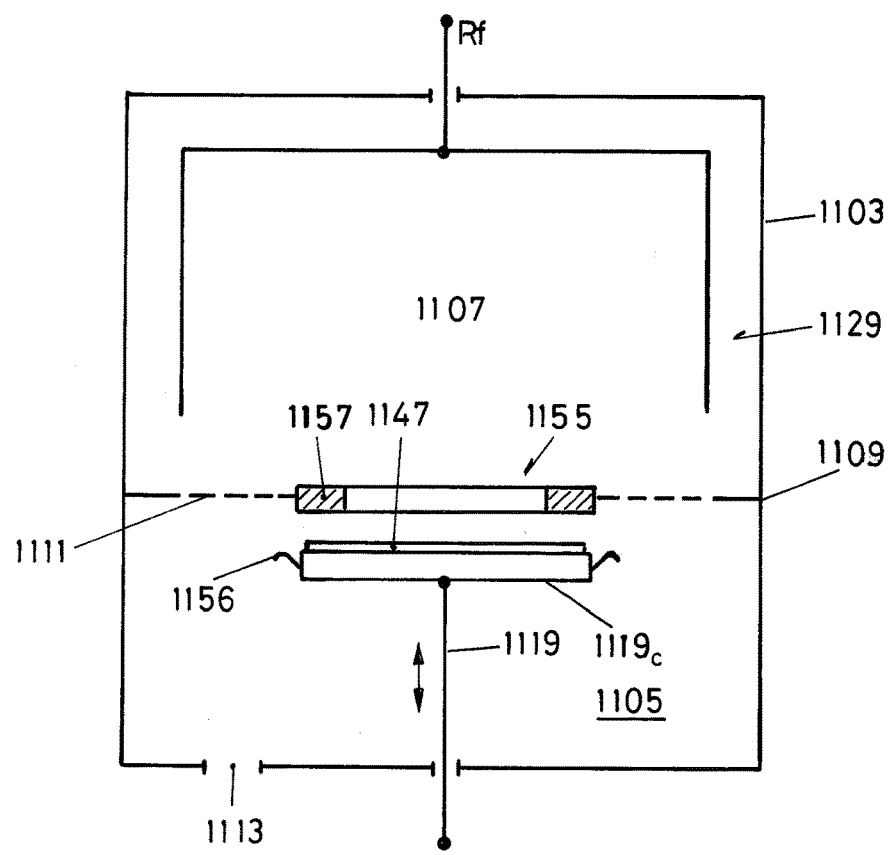
FIG. 11: schematically and simplified one variant of realizing cooperation of the workpiece or substrate support and of the shroud or rim at an embodiment of the apparatus according to the invention.

In opposition to the grounding concept as addressed in context with FIG. 1 according to which the Rf current return path is led via a pair of parallel impedances, namely via the enclosure 3 along the pumping compartment 5 and via the workpiece support 19 down to system ground G, according to the embodiment of FIG. 10 the Rf return path is selected to be as short as possible. The system ground tab 1023 to system ground G is provided centrally at the top of the etching compartment 1007. The grounding concept shown in FIG. 1 may be replaced by the grounding concept of FIG. 10 as in both cases the workpiece carrier, as the second, smaller electrode arrangement, is operated on ground potential and not on a biasing potential. FIG. 11 shows, simplified and schematically an embodiment of the apparatus which, similar to the embodiment of FIG. 1 comprises a pumping compartment 1105 with a large pumping port 1113 and an etching compartment 1107. A handling opening 1155 is confined by the rim or shroud 1109 with the trough-bores or-slits 1111. The handling opening 1155 is bordered by a frame 1157, in a good variant made of a ceramic material.

In opposition to the interaction of the workpiece carrier 19c and the workpiece or substrate 47 with the shroud or rim 9 as shown in FIG. 1, according to the form of realization according to FIG. 11 the shroud 1109 with the frame 1157 acts as a stop for the workpiece or substrate 1147 so that in the etching position of the workpiece carrier 1119c the upper surface of the workpiece or substrate 1147 is positioned substantially flush with the rim or shroud 1109. Thereby the workpiece or substrate 1147 in its etching position becomes firmly biased and held between the workpiece carrier 1119c and the frame 1157. Additionally, FIG. 11 shows, that the resilient contact members 1156 may be mechanically coupled to the workpiece carrier 1119c whereas according to FIG. 1 they are mechanically coupled to the shroud 9. Both variants are possible and also a combination in which some of the resilient contact members 56,1156 are mechanically coupled to the movable workpiece carrier 19c, 1119c, some to the stationary rim or shroud 9, 1109. Especially if, as addressed, the border of the shroud or rim mechanically interacts with the workpiece or substrate during the etching operation, it is important to maintain such interaction accurately constant during the processing. In the embodiment of FIG. 11 such interaction is biasing and holding the workpiece or wafer 1147 during etch processing. Thus, generically and especially in this case, high mechanical stability must be achieved also in spite of mutual thermal expansions of different materials and structures which could result in mutual shift and/or warpage of the frame and shroud with the respective effect on the substrate or workpiece, especially on a thin and large substrate.

In spite of the fact, that in the embodiment according to FIG. 3 according to FIG. 3, different thermal expansions of the spokes 12 and of the frame 57 are well considered by the fact that the ends of the spokes 12 are not firmly linked to the frame 57, this FIG. 3 embodiment is not optimal in the case, as of FIG. 11, in which the frame mechanically interacts with the workpiece or wafer 1147, as during etch processing.

Figure 12:
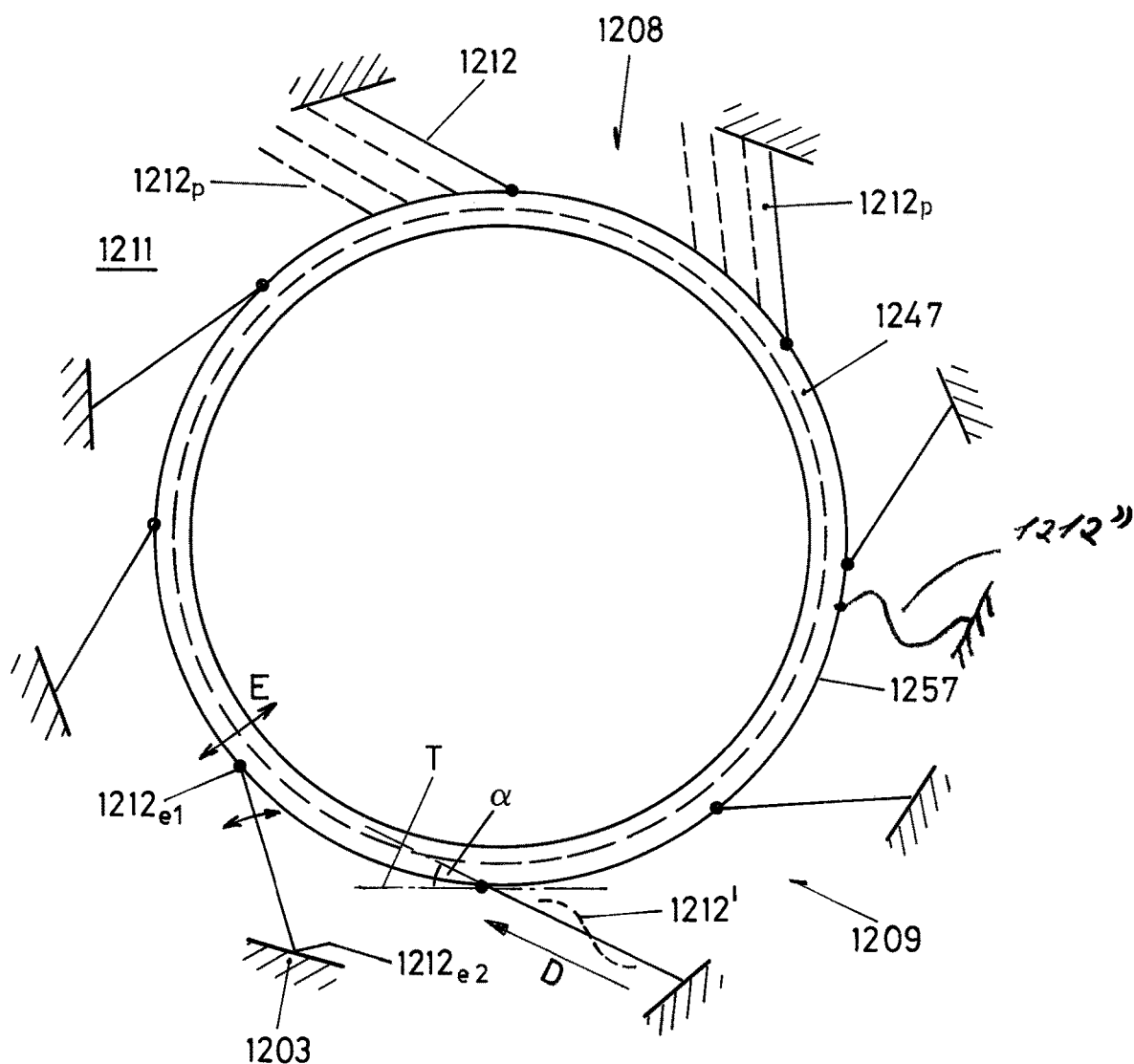
FIG. 12: schematically and simplified the principle of the shroud or rim construction as applied to one embodiment of the apparatus according to the invention.

FIG. 12 shows most schematically and simplified and in a top view on the rim or shroud arrangement 1209, the ring-shaped frame 1257 for a circular workpiece or substrate 1247 in an alternative construction to that shown in FIG. 3. It is tailored to exploit the frame 1257 as a mechanical stop and down-holding member for the substrate 1247 during etch processing. Nevertheless, it may also be applied if the substrate cattier is stationary as addressed above and no stop is in fact needed.

Only a few of the spokes 1212 are shown in FIG. 12. The one ends $1212_{e1}$ of the spokes 1212 are mechanically fixed to the frame 1257, as e.g. by gluing, welding, soldering, screwing. The other ends $1212_{e2}$ are mechanically fixed relative to the enclosure 1203, as represented in FIG. 12 only schematically. All the spokes 1212 together form the rim or shroud 1209 with the through-slits 1211 which are narrow enough to prevent plasma burning therein. The spokes 1212 act as leaf springs with respect to relative expansion E of the frame 1257 with respect to the enclosure 1203. The spokes 1212 which might be curved or bent as schematically shown in dash line at 1212' define for a length direction D and are mounted to the frame 1257 so, that the directions D of length extensions intersect the tangent T on the frame 1257 at the locus of spoke fixation with an angle α which is not 90°, but smaller than 90° down to 0°. Because in the addressed angle range the angle α is not critical with respect to the general leaf-spring effect of the spokes 1212, the spokes 1212 may be arranged mutually parallel over selected sections of the circumference of the frame 1257, as schematically represented in FIG. 12 at 1212*p* in dash lines. In fact the spokes act as bendable members.

The frame 1257 becomes stably mounted by the multitude of spokes 1212 and may freely expand and retract upon thermal loading without any warpage, so that a highly accurate positioning and holding of the workpiece or substrate 1247 is achieved.

As shown in FIG. 12 in at 1212" the spokes or some of the spokes, most generically being compressible or bendable, may also be arranged under α=90° if compressible as by "zig-zag"- or wave-shaped. They in fact then act as compressible members.

Figure 13:
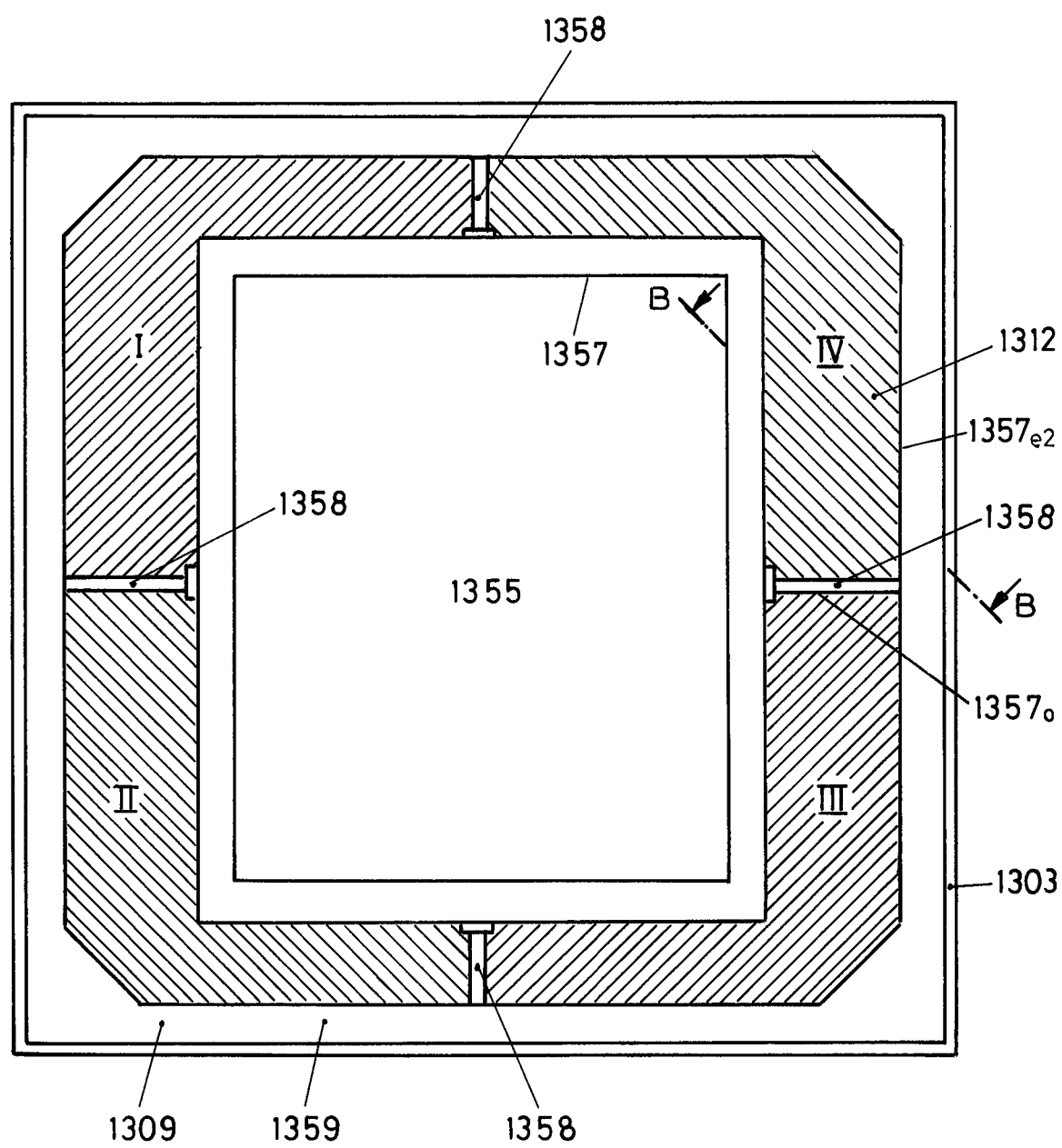
FIG. 13: schematically and simplified an embodiment of the shroud or rim construction as applied to one embodiment of apparatus according to the invention and according to the principle explained with the help of FIG. 12

FIG. 13 shows in a representation in analogy to that of FIG. 3 the rim or shroud 1309 and frame 1357 arrangement for large rectangular substrates or workpieces and constructed in agreement with the generic approach as was just addressed in context with FIG. 12.

Figure 14:
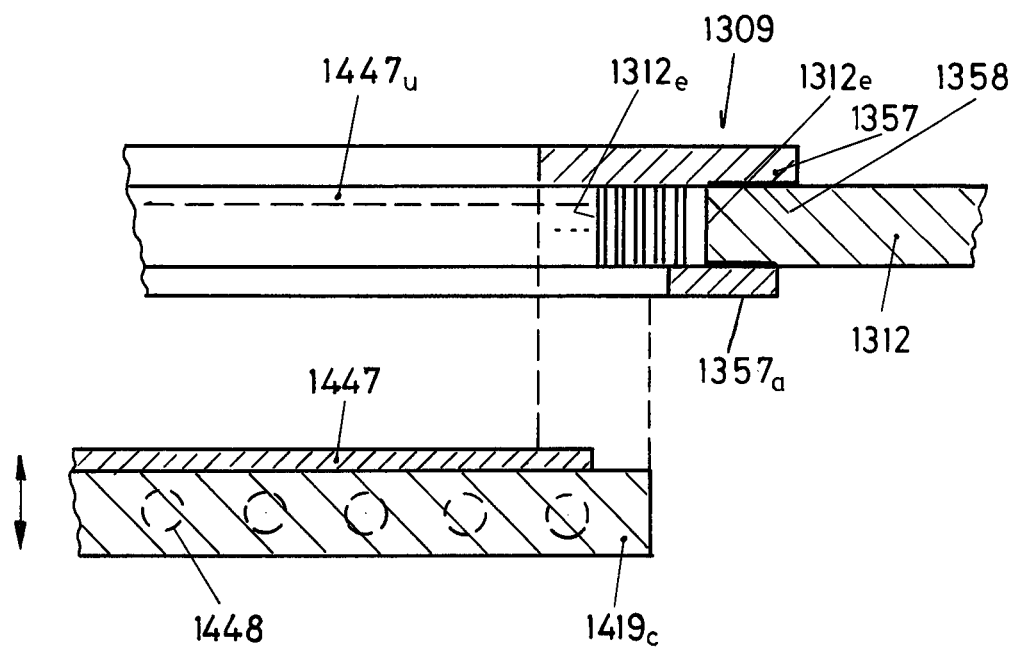
FIG. 14: schematically and simplified, in a partial cross-sectional representation along line B-B of FIG. 13, the interaction of the liftable and retractable workpiece carrier with the substrate or workpiece, with the rim or shroud and frame arrangement as of FIG. 13.

FIG. 14 shows in a partial cross-sectional representation along line B-B of FIG. 13 the interaction of the liftable and retractable workpiece carrier 1419*c* with the substrate or workpiece 1447 with the rim or shroud 1309 and frame 1357 arrangement as of FIG. 13.

According to FIG. 13 and FIG. 14, in analogy to the teaching of generic FIG. 12, the frame 1357 defines the square-shaped handling opening 1355 for a square substrate or workpiece.

As may be seen from FIG. 14 and in analogy to FIG. 12 the one ends $1312_{e1}$ of the spokes 1312 are fixed to the frame 1357. In the specific example, hey are glued at 1358 and biased between the frame 1357 and a frame counterpart $1357_a$ in a good embodiment both made of ceramic material as of aluminum oxide.

The other ends $1357_{e2}$ (see FIG. 13) are rigidly connected directly or indirectly to the enclosure 1303. Four sections I to IV of respectively directed spokes 1312 are provided separate by webs 1358 which are not fixed to the frame 1357/$1357_a$ as being provided perpendicularly to the frame tangent at the locus of mutual intersection. In a good embodiment the spokes 1312 the webs 1358 and a surrounding frame like part 1359 of the overall shroud or rim 1309 are made of a unitary metal plate into which the slits between the spokes 1312 are machined.

As becomes apparent from FIG. 14, the workpiece carrier 1419$_c$ bypasses, when moved in edge-processing position 1147$_u$, the border of the frame counterpart $1357_a$, so that the workpiece or substrate 1447 becomes biased towards the frame 1357.

It has to be pointed out, that instead of making use of a substrate-holding frame as of frame 1357, the substrate or workpiece may be held firmly on the workpiece carrier, as of 1419$_c$, differently, e.g. by making use of electro static forces, thus by means of an electro static chuck or by a vacuum chuck establishing below the substrate or workpiece a pressure, which is smaller than the vacuum exploited for the edging process. In such a case, thermal loading of the shroud or rim might be substantially less critical.

Differently tailored workpiece carriers or chucks may be exchangeably applied in the capacitive coupled RF vacuum etching apparatus according to the invention.

In one embodiment, the workpiece carrier is cooled. It comprises a system of channels for a liquid cooling medium as addressed in dashed lines in FIG. 14 at 1448 and in FIG. 1 in dashed lines as well, at 20.

In embodiments as were addressed, the vacuum enclosure is separate in a pumping compartment and in an etching compartment and the substrate or workpiece is firmly biased and held on a workpiece carrier. Cooling of the workpiece or substrate is improved by establishing a cushion of heat conducting gas between the cooled workpiece carrier and the bottom surface of the workpiece or substrate. The heat conducting gas flows from the interspace between the cooled surface of the workpiece carrier and the bottom surface of the workpiece or substrate into the pumping compartment and only neglectably into the etching compartment.

Figure 15:
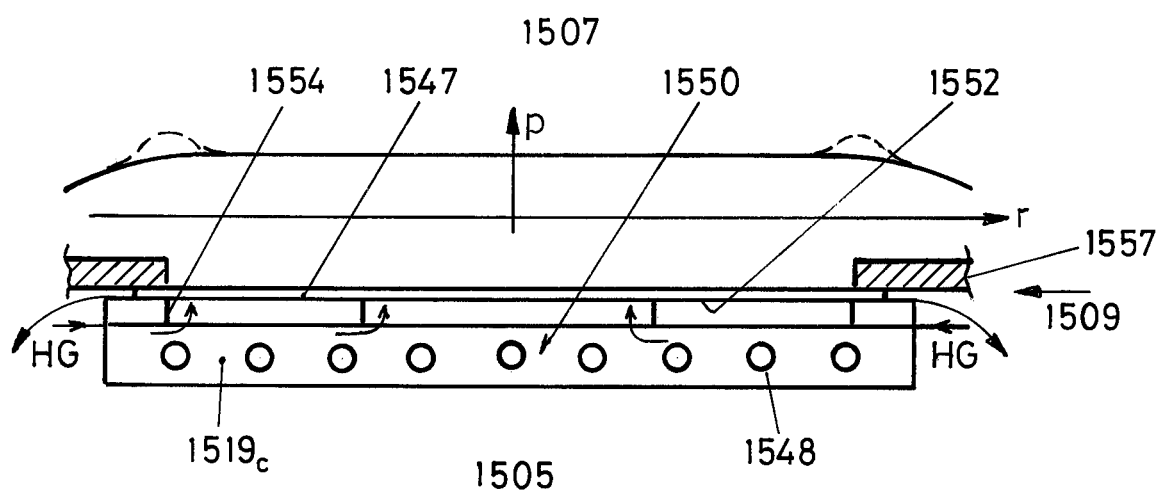
FIG. 15: schematically and simplified a partial representation of the workpiece carrier as provided in one embodiment of the apparatus according to the invention.

This approach at an embodiment of the apparatus, is schematically shown in FIG. 15. The workpiece carrier 1519 is cooled as by means of a system of channels 1548 for a liquid cooling medium. The workpiece carrier 1519$_c$ further comprises a gas-channel system 1550 adjacent and along its upper surface 1552. Bores or slits 1554 connect the gas channel system 1550 to the surface 1552 of the workpiece carrier 1519$_c$. The gas channel system 1552 is connected to a gas source for a heat conduction gas (not shown). The gas channel system 1552 and the slits or bores 1554 are tailored so as to establish along the bottom surface of the workpiece or substrate 1547 a substantially homogeneous pressure distribution at most with an increased pressure along the periphery of the workpiece carrier 1519$_c$ and thus along the periphery of a substrate or workpiece 1547. The skilled artisan knows how to establish a respective pressure distribution along the bottom surface of the workpiece or substrate by respectively tailoring the distribution of the flow resistances along the gas channel system 1552 and/or the distribution of the bores or slits 1554 and/or the distribution of the flow resistances of the bores or slits 1554.

As schematically shown qualitatively over the radial extent r of the workpiece carrier 1519, the pressure p is established to be substantially constant along the surface of the workpiece carrier or with a respective maximum, as shown in dashed lines, along the periphery of the substrate or workpiece 1547.

In those embodiments of the apparatus in which a shroud or rim divides the overall vacuum recipient or enclosure in an etching compartment and in a pumping compartment, the heat conducting gas flow may leave the interspace between the substrate or workpiece and the upper surface of the workpiece carrier merely into the pumping compartment as shown in FIG. 15 at HG. Here the etching compartment 1507 is separate from the pumping compartment 1505 by the shroud or rim arrangement 1509. During processing the workpiece or substrate 1547, the workpiece or substrate 1547 is mechanically held e.g. by the frame 1557 and substantially seals the etching compartment from the pumping compartment. Thus the two compartments communicate with respect to gas flow and during processing merely through the bores or slits in the shroud or rim 1509. Because the interspace between the upper surface of the cooled workpiece carrier 1519*c* and the bottom surface of the workpiece or substrate 1547 is located, during processing, on the pumping compartment-1505-side of the frame 1557, the heat conducting gas HG leaves the addressed interspace exclusively into the pumping compartment 1505. Thereby, the edging compartment and the edging process is not influenced by the heat conducting gas HG as e.g. He.

Figure 16:
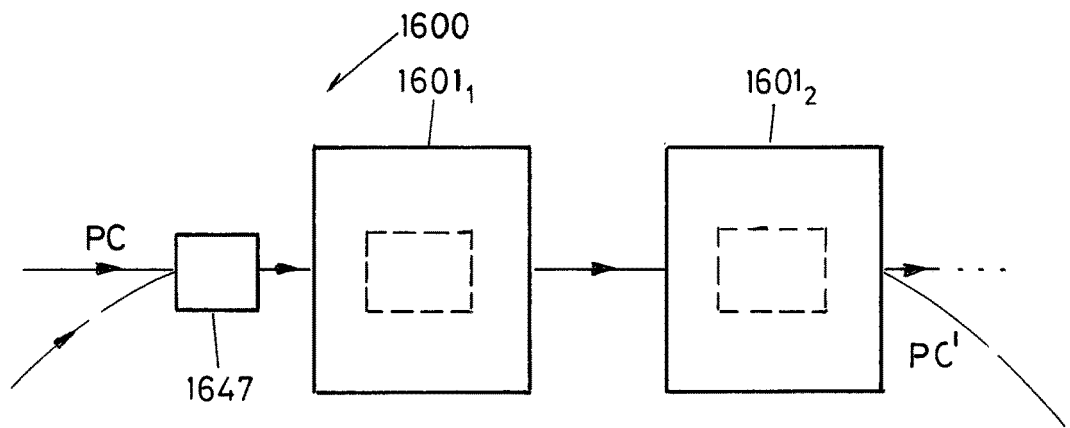
FIG. 16: schematically and simplified an inline plant according to the present invention with one or more than one apparatus according to the invention.

One or more than one apparatus according to the invention may be exploited in a so called inline workpiece or substrate processing plant, wherein at least one workpiece or at least one batch of workpieces is transported from one processing station to the next in a fixed sequence of processing stations. Such a plant is schematically shown in FIG. 16.

A workpiece or substrate or a batch of workpieces or substrates 1647 is conveyed along a processing plant 1600, comprising chain of treating stations $1601_1$, $1601_2$ .... At least one of the treating stations is an apparatus according to the invention under at least one of its aspects. The treating station $1601_1$ may e.g. be a degasser station, the treating station $1601_2$ the addressed apparatus. In the plant 1600 according to FIG. 16 one workpiece or substrate or one batch thereof is simultaneously treated in each of the treating stations $1601_n$ and one workpiece or substrate or one batch thereof is simultaneously conveyed from one treatment station to the next one. If we address a single workpiece or substrate also as a batch (just with one single workpiece or substrate) in the embodiment of the inline plant 1600 of FIG. 16, the extent of batches conveyed and of batches treated is constant along the chain. The path of conveyance PC may thereby be linear or curved e.g. circularly bent as exemplified in dash line at PCF'. The apparatus provided and according to the invention may be constructed with a liftable workpiece carrier or with not-liftable workpiece carrier. If more than one such apparatus is provided, some may be constructed with liftable workpiece carrier, some with not-liftable workpiece carrier. They need not be constructed equally but may incorporate one or more than one different embodiments.

Figure 17:
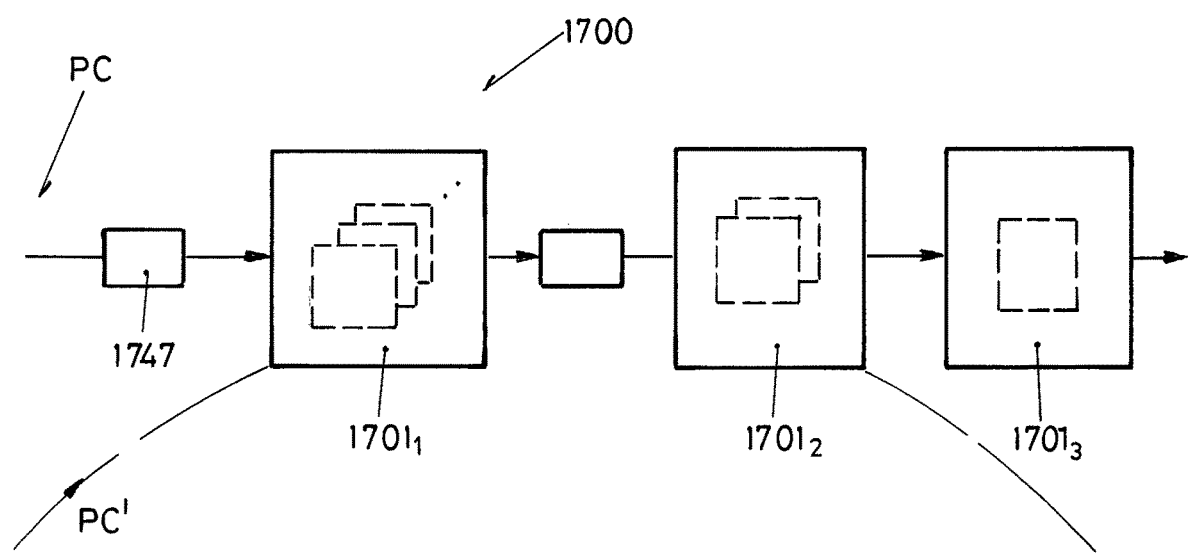
FIG. 17: schematically and simplified a further embodiment of the plant according to the invention.

In the FIG. 17—embodiment of an inline plant 1700 incorporating at least one of the apparatus according to the invention and possibly realizing at least one embodiment thereof, the number of batches (possibly of just one workpiece or substrate) simultaneously treated in the treating stations $1701_1$, $1701_2$, $1701_3$ is different. As an example, a degasser station $1701_1$ simultaneously treats a number N of batches, a cooling station $1701_2$ simultaneously treats a different number M of batches, whereas the apparatus according to the invention, $1701_1$, treats one batch simultaneously. The average rate of batches input to and of batches output from the treatment stations is equal.

Thereby the number of batches simultaneously input to and simultaneously output from a treatment station considered may be different. The path of conveyance PC may be linear or curved e.g. circularly bent as exemplified in dash line at PC'. The apparatus provided and according to the invention may be constructed with a liftable workpiece carrier or with a not-liftable workpiece carrier. If more than one apparatus is provided, some may be constructed with liftable workpiece carriers, some with not-liftable workpiece carriers. They need not be constructed equally.

Figure 18:
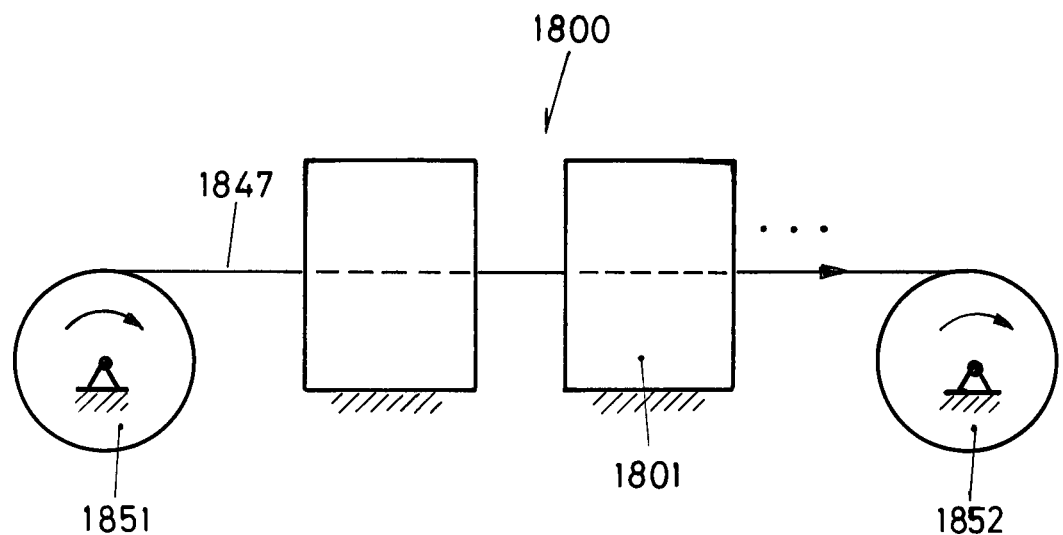
FIGS. 18 and 19: schematically and simplified further embodiments of the plant according to the invention.

FIG. 18 shows a specific example of an in-line plant 1800 incorporating one or more than one apparatus according to the invention.

The workpiece or substrate is a foil 1847 unwound from a coil 1851 and rewound on a coil 1852. Between the coils the foil 1847 is passed through a vacuum processing plant 1800 incorporating at least one apparatus 1801 according to the invention. In this embodiment, the workpiece carrier of the apparatus 1801 is not-liftable.

Figure 19:
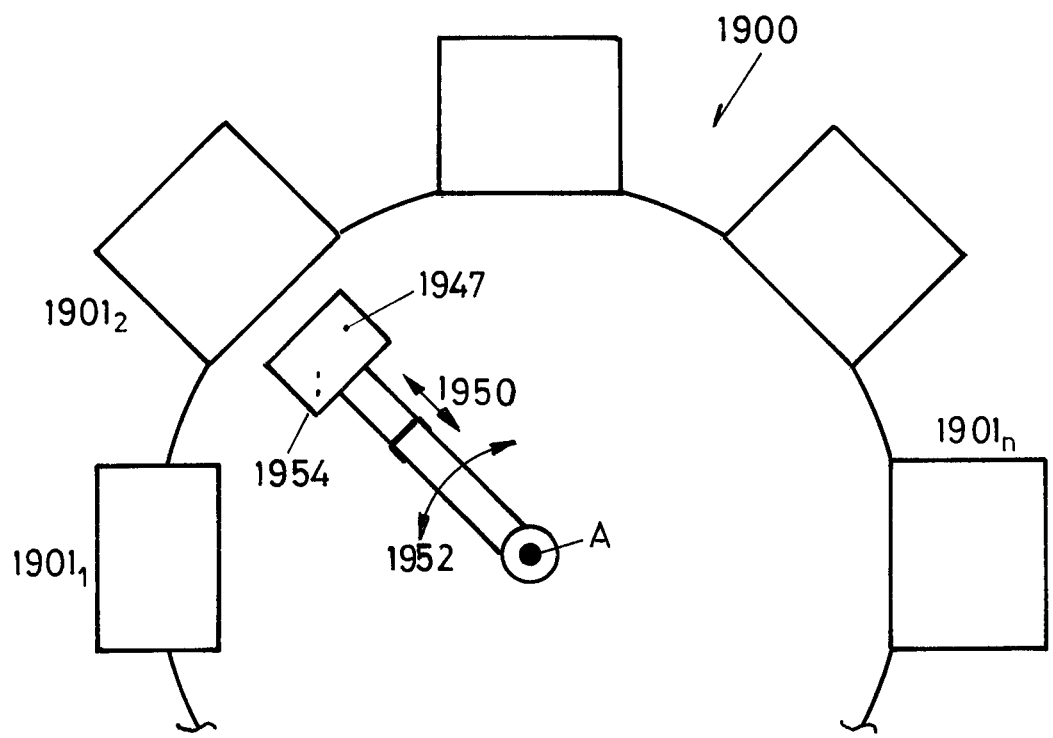

According to FIG. 19 least one apparatus according to the invention is integrated in a non-inline plant 1900 which may be said a cluster-plant. More than one treating stations $1801_1$, $1801_2$ etc. are loaded and unloaded with one or more than one batch 1947 (the batch may comprise only one workpiece or substrate) by a central handler 1950. The handler 1950 has at least one drivingly expandable and retractable arm 1952 with a support 1954 for the batch 1947 and is drivingly rotatable about the central axis A. In this plant which incorporates at least one of the reactors according to the invention, the sequence of treating stations to which a batch 1947 is fed, the number of batches 1947 simultaneously conveyed, the number of batches simultaneously treated in respective treating stations and the treatment durations in the respective treatment stations is selectable and variably controllable. The apparatus provided and according to the invention may be constructed with a liftable workpiece carrier or with a not-liftable workpiece carrier. If more than one apparatus are provided, some may be constructed with liftable workpiece carriers, some with not-liftable workpiece carriers. They need not be constructed equally.

Summarizing a Further Aspect of the Vacuum Apparatus as Described Considered Possibly Inventive Per Se:

A vacuum apparatus comprising an enclosure (3) and a workpiece carrier and wherein said enclosure (3) is subdivided in a pumping compartment (7) comprising a pumping port (13) and a treating compartment (5) said compartments (5,7) being separate by a shroud or rim (9) having a pattern of through openings or through slits (11), baring plasma at predetermined processing conditions, said workpiece carrier being drivingly movable from a load-/unload position into a processing position and vice versa, a workpiece or substrate on said workpiece carrier (19c) being mechanically held (57) on said workpiece carrier in said processing position by a downholding member (57) and all along the periphery of the workpiece or substrate surface exposed to said treating compartment, said workpiece carrier (19c) comprising a channel arrangement (20) adapted to hold a liquid heating or cooling medium and a further channel arrangement adapted to hold a heat conduction gas communicating by a bore- or slit-arrangement with an interspace between the surface of said workpiece or substrate opposite said surface being exposed to said treating compartment.

What is claimed is:

1. A capacitively coupled RF vacuum etching apparatus constructed for etch operating under predetermined conditions and comprising:

a vacuum recipient—also addressed as enclosure— in said vacuum recipient a plasma space in operational contact solely with one electrode arrangement consisting of a first electrode arrangement and of a second electrode arrangement facing said first electrode arrangement;

said first electrode arrangement defining a first electrode surface exposed to said plasma space;

said second electrode arrangement defining a second electrode surface exposed to said plasma space, and comprising the surface of a workpiece carrier;

the first electrode surface being larger than the second electrode surface;

said first electrode arrangement being electrically connected to an output arrangement of a Rf generator arrangement via a match box arrangement, generating a plasma supply Rf signal; and all components of said first electrode arrangement being at a common electrical RF potential and all components of said second electrode arrangement being at a common electrical potential, wherein said first electrode arrangement comprises a metal body with opposing upper and lower surfaces and peripheral edges that are freely exposed to and fully immersed in said plasma space, said opposing upper and lower surfaces and said peripheral edges being a part of said first electrode surface.

2. The capacitively coupled RF vacuum etching apparatus according to claim wherein said metal body comprises a pattern of through openings and/or through slits tailored so that, in operation, plasma burns in said through openings at said predetermined conditions.

3. The capacitively coupled RF vacuum etching apparatus according to claim 1, wherein said first electrode surface comprises a first surface area extending along a first plane, a second surface area extending along a second plane, said first and second surface areas defining an interspace tailored so that, in operation, plasma is burning in and along said interspace at said predetermined conditions.

4. The capacitively coupled RF vacuum etching apparatus according to claim 3, wherein said second electrode surface comprises a surface area extending along a third plane and said first, second and third planes are parallel planes.

5. The capacitively coupled RF vacuum etching apparatus according to claim 1, wherein said metal body is a plate.

6. The capacitively coupled RF vacuum etching apparatus according to claim 1, wherein:
said Rf generator arrangement generates at least one first plasmas supply signal at a very high frequency at said output arrangement and at least one second plasma supply signal at a high frequency lower than said very high frequency at said output arrangement,
said first electrode arrangement is electrically connected via said match box arrangement to said output arrangement and is electrically supplied, in operation, by said first and by said second plasma supply signals;
said second electrode arrangement is, at least during etching operation, electrically connected to a system ground tab.

7. The capacitively coupled RF vacuum etching apparatus according to claim 6, wherein said first plasma supply signal and said second plasma supply signal are connected to said first electrode arrangement at locally different contact points.

8. The capacitively coupled RF vacuum etching apparatus according to claim 1, wherein said Rf generator arrangement is connected to said first electrode arrangement at more than one locally different contacting points.

9. The capacitively coupled RF vacuum etching apparatus according to claim 6, wherein
there is valid:

$$10 \text{ MHz} \leq f_{vhf} \leq 400 \text{ MHz}$$

or $$10 \text{ MHz} \leq f_{vhf} \leq 300 \text{ MHz}$$

or $$20 \text{ MHz} \leq f_{vhf} \leq 300 \text{ MHz}$$

or $$20 \text{ MHz} \leq f_{vhf} \leq 100 \text{ MHz}$$

and:

$$0.01 \, f_{vhf} \leq f_{hf} \leq 0.5 \, f_{vhf}$$

or $$0.05 \, f_{vhf} \leq f_{hf} \leq 0.5 \, f_{vhf}$$

$f_{hf}$ being the frequency of the high frequency supply signal and $f_{vhf}$ the frequency of the very high frequency supply signal.

10. The capacitively coupled RF vacuum etching apparatus according to claim 1, wherein said workpiece carrier is drivingly movable towards and from said first electrode arrangement.

11. The capacitively coupled RF vacuum etching apparatus according to claim 1, wherein said workpiece carrier is not movable towards and from said first electrode arrangement.

12. The capacitively coupled RF vacuum etching apparatus according to claim 1, wherein said workpiece carrier is not movable towards and from said first electrode arrangement and said first electrode arrangement comprises a drivingly movable door for loading/unloading a workpiece.

13. The capacitively coupled RF vacuum etching apparatus according to claim 1, wherein said enclosure is subdivided into a pumping compartment comprising a pumping port and in an etching compartment comprising said first electrode arrangement, said compartments being separated by a shroud or rim having a pattern of through openings or through slits, tailored so, that, in operation, plasma does not burn therein at said predetermined etching conditions.

14. The capacitively coupled RF vacuum etching apparatus according to claim 1,
wherein said enclosure is subdivided into a pumping compartment comprising a pumping port and in an etching compartment comprising said first electrode arrangement, said compartments being separated by a shroud or rim, said shroud or rim holding a frame defining a workpiece access opening to said etching compartment, said frame being held by said shroud or rim by means of a multitude of spokes mutually defining through-gaps between said pumping and said etching compartments, said though-gaps being tailored so that, in operation, plasma does not burn therein at said predetermined etching conditions, said frame being held by said rim or shroud by means of said spokes.

15. The capacitively coupled RF vacuum etching apparatus according to claim 1, wherein said enclosure is subdivided into a pumping compartment comprising a pumping port and an etching compartment comprising said first electrode arrangement, said compartments being separated by a shroud or rim, having a pattern of through openings or through slits tailored so, that, in operation, plasma does not burn therein at said predetermined etching conditions, said shroud or rim holding a frame defining a workpiece access opening to said etching compartment, said frame being mounted to said shroud or rim, said workpiece carrier being drivingly movable from a load-/unload position into a processing position and vice versa, said frame acting as a downholding member for a workpiece or substrate on said workpiece carrier in said processing position.

16. The capacitively coupled RF vacuum etching apparatus according to claim 1, wherein said enclosure is subdivided into a pumping compartment comprising a pumping port and an etching compartment comprising said first electrode arrangement, said compartments being separated by a shroud or rim, said shroud or rim holding a frame defining a workpiece access opening to said etching compartment, said workpiece carrier being drivingly movable from a load-/unload position into a processing position and vice versa, said frame acting as a downholding member for a workpiece or substrate on said workpiece carrier in said processing position and said shroud or rim being linked to said frame by means of a multitude of spokes mutually defining through-gaps between said pumping and said etching compartments, said through-gaps being tailored so, that, in operation plasma does not burn therein at said predetermined etching conditions, said frame being mounted to said shroud or rim by means of said spokes in such a manner, that said frame may freely expand and retract under thermal loading.

17. The capacitively coupled RF vacuum etching apparatus according to claim 14, wherein said spokes are constructed as compressible and/or bendable members.

18. The capacitively coupled RF vacuum etching apparatus at least according to claim 14, wherein said spokes define a direction of length extent each and are mounted to said frame so, that the respective direction of length extent intersect the tangent on said frame at the locus of respective spoke fixation with an angle α for which there is valid:

$90°>\alpha\geq0°$.

19. The capacitively coupled RF vacuum etching apparatus according to claim 1, wherein said workpiece carrier comprises a channel arrangement adapted to receive a liquid heating or cooling medium.

20. The capacitively coupled RF vacuum etching apparatus according to claim 1, wherein said enclosure is subdivided into a pumping compartment comprising a pumping port and in an etching compartment comprising said first electrode arrangement, said compartments being separated by a shroud or rim having a pattern of through openings or through slits, tailored so, that, in operation, plasma does not burn therein at said predetermined etching conditions, said workpiece carrier being drivingly movable from a load-/unload position into a processing position and vice versa, a downholding member constructed to hold a workpiece or substrate down on said workpiece carrier in said processing position at and along the periphery of the workpiece or substrate surface exposed to said etching compartment, said workpiece carrier comprising a channel arrangement adapted to receive a liquid heating or cooling medium and a further channel arrangement adapted to receive a heat conduction gas and discharging by a bore- and/or slit-pattern at the carrier-surface of said workpiece carrier for said workpiece or substrate.

21. The capacitively coupled RF vacuum etching apparatus according to claim 20, said further channel arrangement and pattern of bores and/or slits discharging at said carrier-surface being tailored so as to establish along the periphery of an interspace between said carrier-surface and a substrate or workpiece a pressure of heat conducting gas which is at least equal to the pressure in the and along the more central parts of said interspace.

22. The capacitively coupled RF vacuum etching apparatus according to claim 1, wherein said enclosure is subdivided into a pumping compartment comprising a pumping port and in an etching compartment comprising said first electrode arrangement, said compartments being separated by a shroud or rim having a pattern of through openings or through slits being tailored so that, in operation, plasma does not burn therein at said predetermined etching conditions, said shroud or rim being a part of said enclosure or comprising a part of said enclosure and a part of said first electrode arrangement.

23. The capacitively coupled RF vacuum etching apparatus according to claim 1, wherein said enclosure is subdivided into a pumping compartment comprising a pumping port and an etching compartment comprising said first electrode arrangement, said compartments being separated by a shroud or rim having a pattern of through openings and/or through slits, being tailored so that, in operation, plasma does not burn therein at said predetermined etching conditions, said workpiece carrier being drivingly movable from a load-/unload position into a processing position and vice versa, said shroud or rim being electrically connected to said workpiece support in said processing position by distinct, distributed and resilient contact members.

24. The capacitively coupled RF vacuum etching apparatus according to at least claim 1, wherein
said Rf generator arrangement generates at least one first plasmas supply signal at a very high frequency at an output arrangement and at least one second plasma supply signal at a high frequency, lower than said very high frequency, at said output arrangement,
said first electrode arrangement is electrically connected via a match box arrangement to said output arrangement and is electrically supplied, in operation, by said first and by said second plasma supply signals;
said second electrode arrangement is electrically connected to a system ground tab
said generator arrangement generating said first plasma supply signal at 60 MHz, said second plasma supply signal at about 13 MHz.

25. The capacitively coupled RF vacuum etching apparatus according to claim 1, the predetermined, pressure condition for said etching being 0.1 to 0.5 Pa both limits included.

26. The capacitively coupled RF vacuum etching apparatus according to claim 1, wherein a spacing between a first part of said surrounding surface of said metal body freely exposed to and immersed in said plasma space (PL) and a second part of said first electrode surface, facing said first part is 10 mm to 40 mm.

27. The capacitively coupled RF vacuum etching apparatus according to claim 1, wherein a spacing between a predominant part of said first electrode surface and facing said workpiece carrier and a predominant part of the surface of said workpiece carrier is 40 mm to 80 mm.

28. The capacitively coupled apparatus of claim 1, being shaped for rectangular or square substrates.

29. The capacitively coupled RF vacuum etching apparatus of claim wherein said Rf generator arrangement is constructed to at least one of frequency modulating and of power modulating at least one Rf supply signal to said first electrode arrangement during operation.

30. The capacitively coupled RF vacuum etching apparatus of claim 1, wherein at least one of the following features prevails:
the Rf generator arrangement is tailored to supply a very high frequency supply signal and high frequency supply signal to said first electrode arrangement, the frequency of said very high frequency supply signal being an integer multiple of the frequency of said high frequency supply signal;
the Rf generator arrangement is tailored to supply a very high frequency supply signal and high frequency supply signal to said first electrode arrangement and to phase lock said supply signals;
the Rf generator arrangement is tailored to supply a very high frequency supply signal and high frequency supply signal to said first electrode arrangement and for adjusting mutual phasing of said supply signals;
the Rf generator arrangement is tailored to supply a very high frequency supply signal and high frequency supply signal to said first electrode arrangement and to vary mutual phasing of said supply signals during operation.

31. A workpiece or substrate processing plant comprising at least one capacitively coupled Rf apparatus according to claim and being a plant wherein the stations may be loaded and unloaded with at least one workpiece or substrate at a selectable rhythm by a handler, as by a central handler.

32. A method of etching or of manufacturing etched workpieces or substrates by making use of the capacitively coupled RF vacuum etching apparatus according to claim 1.

33. The method of claim 32, said etching being performed in a reactive gas atmosphere.

34. The method of claim 33, said reactive gas atmosphere containing oxygen or oxygen and fluorine.

\* \* \* \* \*